US006792120B1

United States Patent
Szenics

(10) Patent No.: US 6,792,120 B1
(45) Date of Patent: Sep. 14, 2004

(54) AUDIO SIGNAL ENHANCEMENT AND AMPLIFICATION SYSTEM

(76) Inventor: Jonathan M. Szenics, 1 Braintree Ct., Flemington, NJ (US) 08822

( * ) Notice: Subject to any disclaimer, the term of this patent is extended or adjusted under 35 U.S.C. 154(b) by 0 days.

(21) Appl. No.: 09/511,684

(22) Filed: Feb. 23, 2000

Related U.S. Application Data

(60) Provisional application No. 60/121,542, filed on Feb. 25, 1999.

(51) Int. Cl.[7] .............................................. H03E 21/00
(52) U.S. Cl. ........................ 381/120; 381/61; 381/59; 181/141
(58) Field of Search ........................... 381/120, 61, 59, 381/308, 91, 118, 122, 96, 150; 181/148, 199

(56) References Cited

U.S. PATENT DOCUMENTS

| | | | |
|---|---|---|---|
| 3,009,991 A | 11/1961 | Bekey ............................. 179/1 |
| 3,612,741 A | 10/1971 | Marshall ..................... 84/1.05 |
| 3,798,374 A | 3/1974 | Meyers ........................... 179/1 |
| 4,176,253 A | 11/1979 | Gabr ............................... 179/1 |
| 4,180,706 A | 12/1979 | Bakgaard ........................ 179/1 |
| 4,437,189 A | 3/1984 | Newman ....................... 381/91 |
| 4,592,088 A | 5/1986 | Shimada ...................... 381/90 |
| 4,805,728 A | * | 2/1989 | Carter et al. ................ 181/141 |
| 5,467,400 A | 11/1995 | Keir .............................. 381/61 |
| 5,524,055 A | 6/1996 | Sondermeyer ............... 381/61 |
| 5,705,950 A | 1/1998 | Butler ........................... 330/3 |

* cited by examiner

Primary Examiner—Melur Ramakrishnaiah

(57) ABSTRACT

An audio system includes amplifying with distortion via a first amplifier electrical audio signals from a sound source, such as an electric guitar, for example, to obtain a desired tonal quality in the sound produced from a first loudspeaker driver by the amplified electrical audio signals, simultaneous with applying electrical signals from a piezo film transducer attached to the cone of the first loudspeaker to a second amplifier having a flat response over a desired frequency range, and adjustable low and high frequency rolloff, for driving a second loudspeaker to produce desired perceived tonal quality at relatively low sound pressure levels, with the volume of the sound from the first and second loudspeakers being adjusted to match the acoustics of a room in which the audio system is operating.

29 Claims, 29 Drawing Sheets

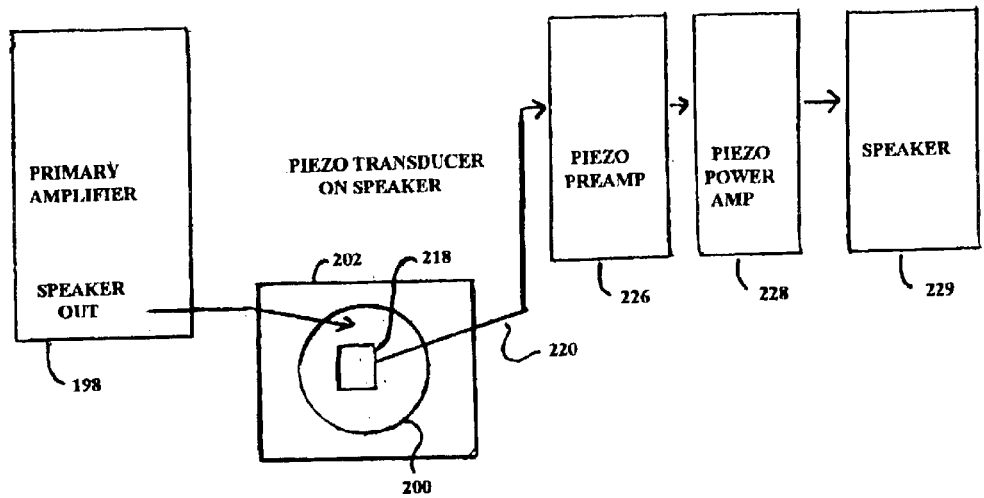

Notes:

198 PRIMARY AMPLIFIER:
1) Practice Amp, Solid State or Tube

200, 202, 218, 220 PIEZO TRANSDUCER ON SPEAKER:
1) Sealed Back Cabinet
2) Floating Speaker
3) Piezo transducer attached to speaker cone
4) Shielded transducer cable
5) Acoustic damping in cabinet
6) No ports

226 PIEZO PREAMP:
1) hi impedance (10 meg) input
2) low preamp tube DC plate voltage, stage set for hi AC gain
3) Baxendall-type tone stack with rolloff adjusted to piezo/speaker enclosure
4) High value interstage coupling cap values

228 PIEZO POWER AMP:
1) Long tail pair phase splitter designed for hi gain
2) Equal value splitter plate load resistors
3) Cathode biased power pentodes ; high value bypass cap
4) High plate voltage, high idle current.
5) 60W output transformer
6) Power supply with silicon rectifiers, minimum filtering

229 SPEAKER:
1) High Efficiency, eg. Electro Voice EV12L
2) Closed back, no porting
3) Acoustic Damping

Fig 4.

AMP Piezo Film Sensors Product Guide

Catalog 65711
Revised 9-95

SDT Shielded Piezo Film Sensors Element with Shielded Cable

The 'S' in SDT Series stands for 'Shielded.' SDT1 piezo film sensor elements are rectangular elements of piezo film with silver ink screen printed electrodes. The sensor area is folded over on itself, giving a self-shielding of the transducer area. This is important in applications where 60 Hz EMI cannot be properly filtered or in applications in a high EMI environment.

The SDT1 can be adhered to other surfaces using double sided adhesives, epoxy or cyanoacrylate (Superglue). Care should be taken if the sensor is to be removed, as the double-side adhesive can peel the metallization from the film.

When adhered to a surface in this manner, the SDT1 is an excellent contact microphone or dynamic strain gage. The output from the SDT1 can input directly to an oscilloscope or a signal analyzer. The low frequency rolloff for the sensor is determined by the input impedance of the electronics. Typical impedances to be used would be at least 1 MΩ for most applications, and may need to be as high as 100 MΩ if 1 to 10-Hz frequencies are being monitored.

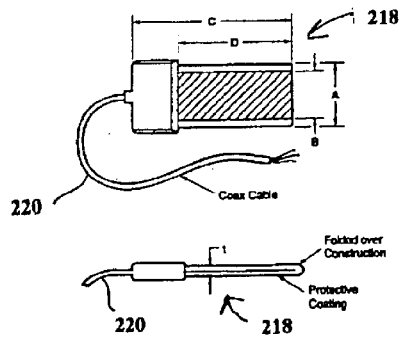

| Description | Dimensions | | | | t (μm) | Cap (nF) | Part No. |
|---|---|---|---|---|---|---|---|
| | A Film | B Electrode | C Film | D Electrode | | | |
| SDT1-028K | .610 15.50 | .500 12.50 | 1.61 41.00 | 1.18 30.00 | 75 | 2.78 | 1-1000288-0 |

AMP Incorporated, Piezo Film Sensors, Valley Forge, PA 19482 610-666-3500

9

For drawings, technical data or samples, contact your AMP sales engineer or call 610-666-3500.
Dimensions are in inches and millimeters unless otherwise specified. Values in brackets are metric equivalents.
Specifications subject to change. Consult AMP for latest specifications.

Fig 5.

AUDIO SIGNAL ENHANCEMENT AND AMPLIFICATION SYSTEM

This application claims the benefit of application 60/121,542 filed Feb. 25, 1999.

FIELD OF THE INVENTION

The field of the present invention relates generally to audio amplifier systems, and more particularly to such systems that purposely distort the amplified audio signals in a manner to enhance the sound produced to accommodate a user's sound preference.

BACKGROUND OF THE INVENTION

The timbre of a musical note is recognizable by the harmonic spectrum associated with the fundamental tone. When a sine wave is applied to an audio device under test (DUT) odd and even order harmonics generated indicate the presence of harmonic distortion.

For audiophile applications, minimization of distortion has become so effective that digital sources (e.g. compact discs, or CD's) are often characterized as being "cold" or "sterile." Judicious amounts of distortion are necessary to "warm up" the signal; the resurgence in popularity of electron vacuum tube circuits in the high-end audiophile market reflects this awareness. Both tube and solid state circuits can be designed to maximize or minimize distortion; tube circuits are inherently more distorted.

The amplification system translates an electrical signal modulated by audio signals to audio or sound waves through a loudspeaker. Speaker design variables can be adjusted to optimize efficiency and low levels of distortion, or early break-up and higher levels of distortion for a given signal amplitude. A speaker cone set in motion by an audio drive signal will generate harmonics associated with the corresponding fundamental frequency. It is generally recognized that even-order harmonics are more musical whereas odd-order harmonics are harsher. The "warm" tone produced by speakers driven to distortion contain subtle harmonics that are recognizable by either a listener or detected by a microphone placed at a distance from the speaker, provided that sound pressure levels are sufficient to result in air movement recognized by the human's auditory conduction system or the mechanical response parameters of the microphone. This has been long recognized in the recording industry, where very sensitive (ribbon) microphones are used to pick up the signal of low wattage single ended tube amplifiers and less sensitive microphones can be used to pick up the higher Db (decibel) levels from more powerful push-pull tube or solid state amplifiers.

To the listener, the timbre of a note is a combination of the associated fundamental frequency and all associated harmonics thereof produced along the signal path. To hear the harmonics produced by a speaker, the loudspeaker must be either very inefficient (early breakup with low applied drive signal strength) or driven to high sound pressure levels. There is significant attenuation of the harmonic content of the audio signal when passing from the speaker through air to the listener or the microphone.

For example, an acoustic guitar has recognizable and desirable tonal characteristics at low volume levels, the same does not hold true for the electric guitar, for example, and other electric musical instruments. With respect to the electric instrument, tonal characteristics are affected by materials and methods of construction and various design features. Hollow, semi hollow, and solid body guitars all sound different when amplified. Types of pickups/transducers and their placement and wiring schema will affect tone.

The electric instrument tone is derived partially from the instrument itself, as in an acoustic guitar, but is significantly dependent on the amplification system employed. Recognizable and desirable electric tonal parameters include attack/decay envelope, timbre and resonance of the fundamental note and harmonics. One problem for amplifier designers has been the ability to generate acceptable and desirable tonal characteristics at all commonly encountered volume levels.

Another problematic area for electric guitar amplifier designers has been the recognition that optimum electric guitar tone is developed by amplification systems using tube technology. There have been many attempts at introducing solid state technology, with varying degrees of success. Tube amplification is still the gold standard by which all other systems are judged. There has been a recent proliferation of hybrid designs. Unfortunately, the formerly "lost art" of tube based circuits will only last as long as tube manufacture continues. Although there is presently a thriving market in used and NOS (new-old-stock tubes), manufacture of new tubes is mainly confined to emerging third world nations that still embrace this technology. The quality of these tubes for musical instrument amplification is an issue of concern, as is their long-term availability as these nations shift technology to solid-state based designs. With respect to the electric guitar, tube amplifiers are still the gold standard by which any new amplifications/signal processing device is judged.

The links in the signal processing chain from electric guitar to amplified audible sound have traditionally included:

ELECTRIC GUITAR;
EFFECTS PROCESSORS;
PREAMPLIFIER/POWER AMPLIFIER; AND
SPEAKER.

A major determinant of desirable electric guitar tone is DISTORTION. This can be introduced at any of the stages noted above. The most desirable tone has traditionally been generated by driving the power amplifier and speaker combination to maximum output.

Common variations on the signal processing chain have included the following arrangements:

ELECTRIC GUITAR passive inductive pickups active pickups contact/ pressure transducers EFFECTS PROCESSORS solid state effects tube effects/ hybrid AMPLIFIER tube preamplifier tube power amplifier solid state preamplifier solid state power amplifier Hybrid: tube preamplifier solid state power amplifier solid state preamplifier tube power amplifier Speaker:

Other approaches have involved amplifying the signal at or about this stage and include speakerless line out (Speaker Emulation), further sound reinforcement thru use of a microphone to secondary amplification systems, (as in miking open speaker for live performance thru a Public Address System or into recording console mixer.) Various forms of speaker isolation boxes are also used, mainly in recording studios, with miking of the enclosed speaker.

Distortion:

A clean (no overdrive) guitar signal has the volume envelope of a plucked string, similar to a piano. Characteristically, the electric guitar sound considered by both players and listeners to be most recognizable as having "good tone" has included a degree of overdrive distortion. This is best described as having some similarities to the waveform of a harmonica or a saxophone although these instruments have characteristic resonance, timbre and volume envelopes which clearly distinguish them from an overdriven electric guitar sound. The electric guitar's dynamic range is reduced as more overdrive is used. This helps to mask the difference in attack between a plucked string, fretboard tapping of notes, and picking techniques used to generate string harmonics. More overdrive produces a relatively constant volume, from note striking through decay. The sustain of the volume envelope is thereby increased, allowing the player artistic freedom to employ techniques and styles not possible with an amplified clean guitar sound or an acoustic guitar.

Various descriptive terms for degrees of distortion have evolved. "Brown" or "thick" refers to subtle overdrive at the start of notes which decays into a cleaner sound. "Clipped" or "overdrive" sounds are rich in harmonics and exhibit long sustain. The preamplifier/amplifier designs noted above have been able to produce the various types of distortion at lower output levels with varying degrees of success. Generally, tone is improved as the preamplifier, power amplifier, and speaker are all pushed to their limits, regardless of the nature (i.e. tube or solid state design) of the component parts. Amplifier manufacturers have taken partial advantage of this by providing separate volume controls for the preamplifier and power amplifier stages in an attempt to promote flexibility in tonal shaping.

Whereas it might seem unusual that amplifier design would be directed toward intentionally promoting distortion, the evolution of guitar amplifiers would indicate that this is the case. Of late, electric guitarists have attempted to get overdriven amplifier/speaker tone by many other methods including low-pass filters, compression, inductive loads, vacuum tube preamplifiers used typically as "tube pedals", and equalization. These are usually introduced early in the signal path, between the instrument and the amplifier. Overall, these have been less than satisfactory and have introduced among other things, significant ergonomic problems. The portable "combo" amplifier (preamplifier/power amplifier/speaker in one easily transportable cabinet) of the 1960's has evolved into multi-amplifier, multi-cabinet, rack mounts, high wattage output rigs that are often played at exceedingly high sound pressure levels to achieve the desired tone.

SUMMARY OR THE INVENTION

An object of the invention is to provide an improved system for enhancing the tone quality of an audio signal amplified through the system and outputted from a loudspeaker.

Another object of the invention is to provide an improved audio signal amplification system for permitting a listener to match the tonal quality to room acoustics in a manner preferred by the listener.

These and other objects of the invention are obtained by amplifying an audio signal via amplifying means for distorting the sound emitted from a loudspeaker connected to the output of an associated amplifier. A piezo film sensor element or transducer is secured to the cone of the first loudspeaker for obtaining an electrical signal corresponding to the sound being emitted by the first loudspeaker. The electrical audio signal obtained from the transducer is then amplified by a second amplifier, preferably having a flat frequency response, for driving a second loudspeaker, whereby the frequency rolloff and volume level of the sound emitted by the second loudspeaker is adjusted to the preference of a listener for matching the sound output from the entire system to the room characteristics and desired sound pressure levels.

BRIEF DESCRIPTION OF THE DRAWINGS

The invention is described with reference to the drawings in which like items are identified by the same reference designation, wherein:

FIG. 4 shows the embodiment of FIG. 1 in greater detail including notes relating to characteristics of various components in the system.

FIGS. 5A and 5B show top plan, and side elevational views from the specification sheet for an "AMP SDT® Shielded Cable", as used in a prototype system built for one embodiment of the invention.

FIG. 7 shows a 60 Hertz distorted sine wave at the output of the second amplifier.

FIG. 8 shows another distorted sine wave at the output of the second amplifier.

FIG. 9 shows the sine wave applied to the input of the first amplifier, before being distorted by the first amplifier to produce the distorted sine wave of FIG. 8.

FIG. 10 shows a 100 Hertz sine wave applied to the input of the first amplifier.

FIG. 11 shows the 100 Hertz sine wave of FIG. 10 after being distorted, and as appearing at the output of the second amplifier.

FIG. 12 shows a sine wave input signal applied to the first amplifier which resulted in the distorted sine wave of FIG. 8, appearing at the output of amplifier.

FIG. 13 shows a guitar note as applied to the input of the first amplifier.

FIG. 14 shows the electrical audio signal for the guitar note of FIG. 13, as detected by the piezo transducer and amplified through the second amplifier.

FIG. 15 shows a sine wave applied to the input of the first amplifier.

FIG. 16 shows the result and distorted sine wave at the output of the second amplifier as derived from the sine wave input of FIG. 15.

FIG. 17 shows another distorted signal appearing at the output of the second amplifier.

FIG. 18 shows a distorted output signal from the second amplifier at a higher gain than that used for producing the output signal of FIG. 17, whereby each of the signals are derived from the same input signal.

FIGS. 19 and 20 each show a distorted sine wave appearing at the output of the second amplifier.

FIG. 21 shows a 600 Hertz sine wave with overtones modulating the output signal at the output of the second amplifier.

FIGS. 22 and 23 show sine wave distorted waveforms appearing at the output of the second amplifier, respectively.

FIG. 24 shows a sine wave as distorted by the first amplifier and applied to the input of the second amplifier, and appearing at the output terminals thereof.

FIG. 25 shows a plurality of individual sine waves as applied to the input of the first amplifier.

FIG. 26 shows a guitar note appearing at the output of the second amplifier.

FIG. 27 shows a guitar note as applied to the input of the first amplifier for producing the distorted output signal at the output terminals of the second amplifier as shown in FIG. 26.

DETAILED DESCRIPTION OF THE INVENTION

Figure 1:
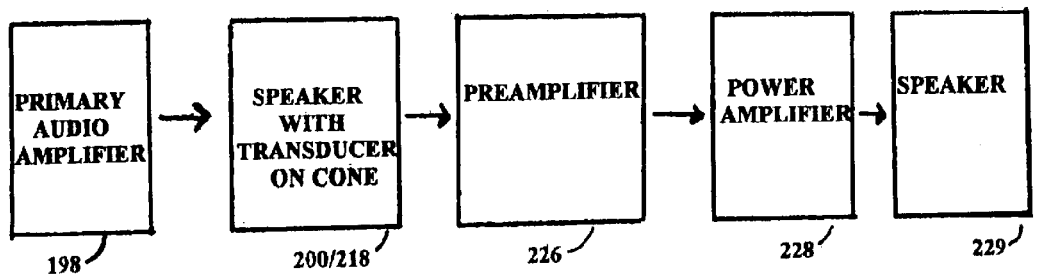
FIG. 1 shows a block schematic diagram of a single channel system for one embodiment of the invention.
Figure 2:
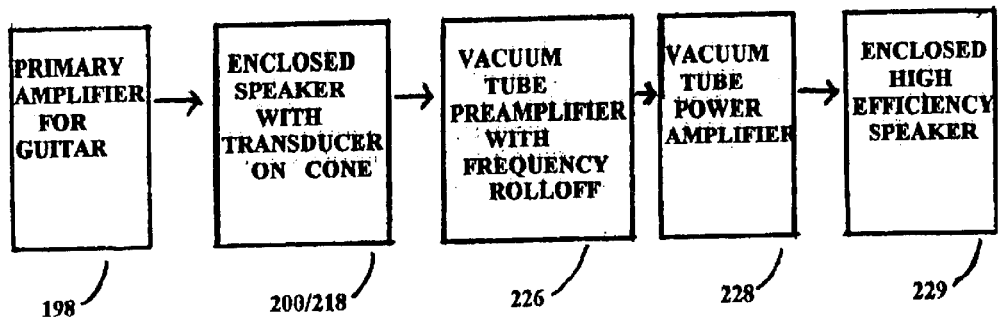
FIG. 2 shows a single channel system for another embodiment of the invention associated with an electric guitar sound source.
Figure 3:
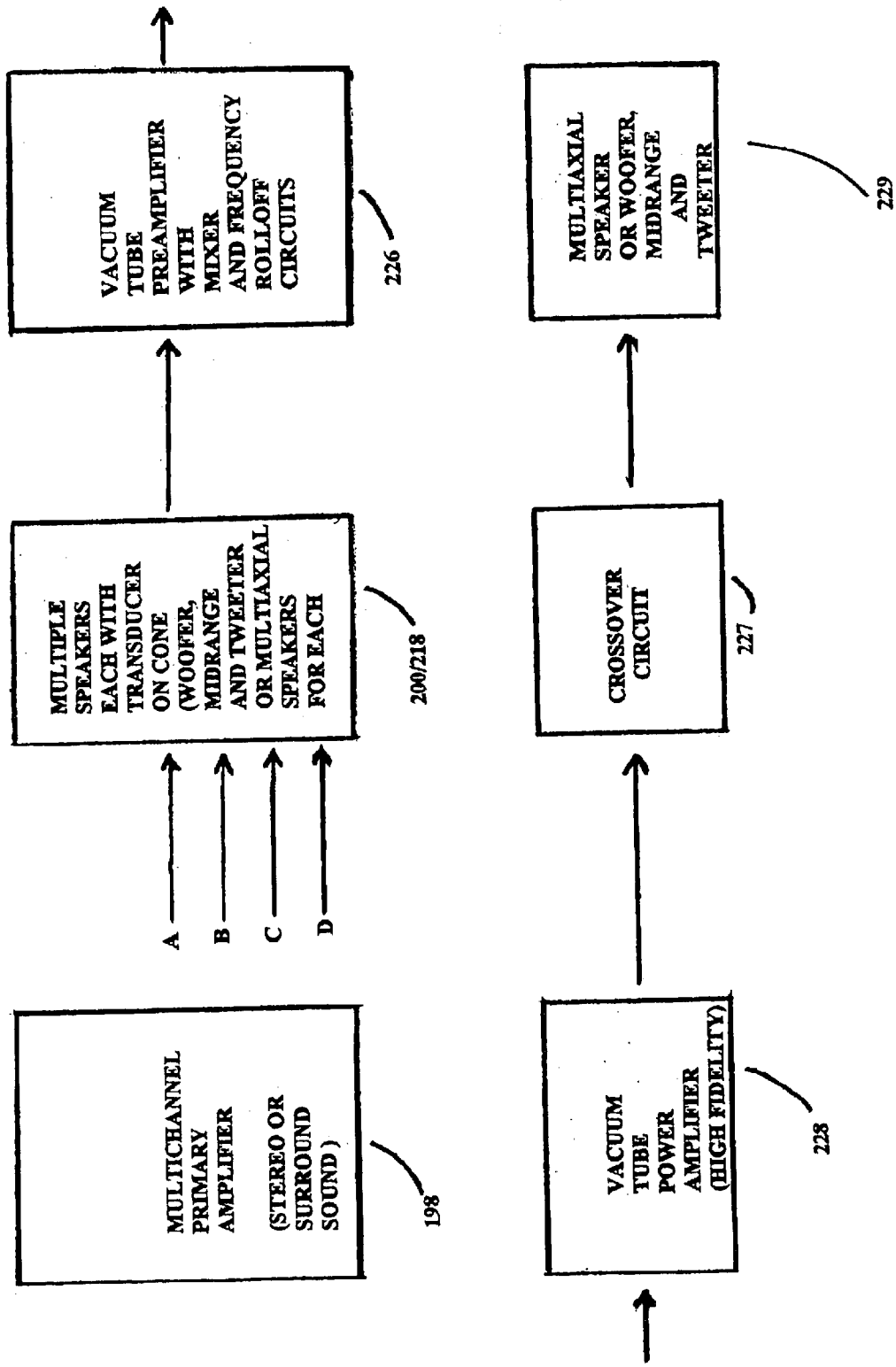
FIG. 3 shows another embodiment of the invention where the sound source or "listening audio" is obtained from a plurality of channels, such as found in stereo, surround sound, and other multichannel sound reproduction systems.

Three embodiments of the invention are shown in FIGS. 1 through 3 in simplified block schematic form. Specific details for implementing these embodiments will follow below. In the embodiment of FIG. 1, a source of audio signals is inputted to a primary amplifier 198 of a high fidelity system or of a musical instrument amplifier system. The output of the primary amplifier 198 is connected to drive a loudspeaker 200. The speaker 200 in a preferred embodiment of the invention has a piezoelectric transducer, such as a piezo film sensor element 218 attached to the cone of the speaker 200, as will be shown in much greater detail with reference to FIGS. 4 and 28A. The output signal from the piezo film sensor 218 is connected to a preamplifier 226 for driving a power amplifier 228, for in turn driving a second loudspeaker 229. As further described below, this inventive configuration permits a user to optimize the tonal characteristics of the sound obtained from the subject system.

As shown in the embodiment of the FIG. 2, the source of audio signals derived from the primary amplifier 198 can be guitar signals, with amplifier 198 driving an enclosed 12" loudspeaker, for example. Also, a vacuum tube preamplifer having its frequency rolloff characteristics tailored to the signal source and acoustical charactistics of the speaker enclosure for the high efficiency 12' speaker 229 can be implemented, for example. Also, the power amplifier 228 can be a vacuum tube power amplifier driving a high efficiency enclosed 12" speaker 229, as shown in this example. For reasons given below, it is preferred that preamplifier 226 and power amplifier 228 are vacuum tube amplifiers. However, the invention is not limited to the use of vacuum tube amplifiers, and can be readily implemented with solid-state preamplifiers and amplifiers, depending upon the application.

In FIG. 3, the primary amplifier 198 can be such to provide a multichannel source of audio signals, such as used in a stereo system, surround sound, and so forth. In the latter embodiment, more than one speaker 200 is required, such as a woofer speaker, midrange speaker, and tweeter, each of which would have a piezo film sensor 218 attached to their respective cones (not shown), for example. The preamplifier 226 may include a mixer circuit for receiving the individual signals from the multiple piezo film sensors 218 to the power amplifier 228, which in this example would be a high fidelity power amplifier 228. The output of amplifier 228 is passed through a crossover circuit 227 for providing electrical signals for driving multiple speakers 229 including an individual woofer, midrange, and tweeter, or a multiaxial speaker 229 incorporating a woofer, midrange, and tweeter capability, for example. The various embodiments of the invention illustrated in FIGS. 1 through 3 are given for purposes of example, and are not meant to be limiting. The primary aspects of the invention can be practiced in many different systems for enhancing the audio output characteristics of a system.

In broad terms, the invention, as shown in FIG. 4, includes a transducer circuit in which a lower ambient volume output signal of a primary amplifier 198 driving a loudspeaker 200 is coupled to the input of a secondary amplifier 228, for driving a second loudspeaker 229. The desired tonal characteristics of an overdriven signal are developed at relatively low ambient-volume levels with the primary amplifier 198. The audible signal developed by the primary amplifier 198 driving loudspeaker 200 is converted by the piezoelectric transducer or film sensor 218 into an electrical signal for driving the preamplifier 226, power amplifier 228, and speaker 200 to the desired level of distortion at low ambient sound pressure levels through the use of a matched speaker 200 and/or speaker isolation. It has been demonstrated that tube amplifiers, solid state amplifiers, and hybrid designs can be used for providing primary amplifier 198, preamplifier 226, and power amplifier 228 to generate acceptable and desirable tone for an electric guitar, in this example. The harder the signal processing chain is driven, the better the tone. The requirement for operating at peak power levels is less critical for vacuum tube amplifier designs used in the primary stage 198. Solid state and hybrid solid state/tube amplifiers emulate the desired tonal characteristics and attack envelope when highly driven in the preamplifier 226, power amplifier 228, and speaker 229 stages. Optimum tonal characteristics are derived in all instances when the power amplifier 228 and speaker 229 are at high output close to "speaker breakup."

A polymer piezoelectric transducer film sensor 218 (See FIGS. 4 and 5) is permanently adhered in direct contact to the cone of primary speaker 200. The output power level of the primary amplifier 198, efficiency level of the primary speaker 200, and degree of baffling/enclosure/isolation of the primary speaker 200 can be adjusted to permit optimization of overdrive characteristics and ambient sound pressure levels.

A prototype system has been designed and developed where the desired outcome is maximum note sustain (long decay time) and second order harmonic distortion. The system has been also designed to maximize compression. To effect this end, following much experimentation, the following considerations have been employed.

Figure 28A:
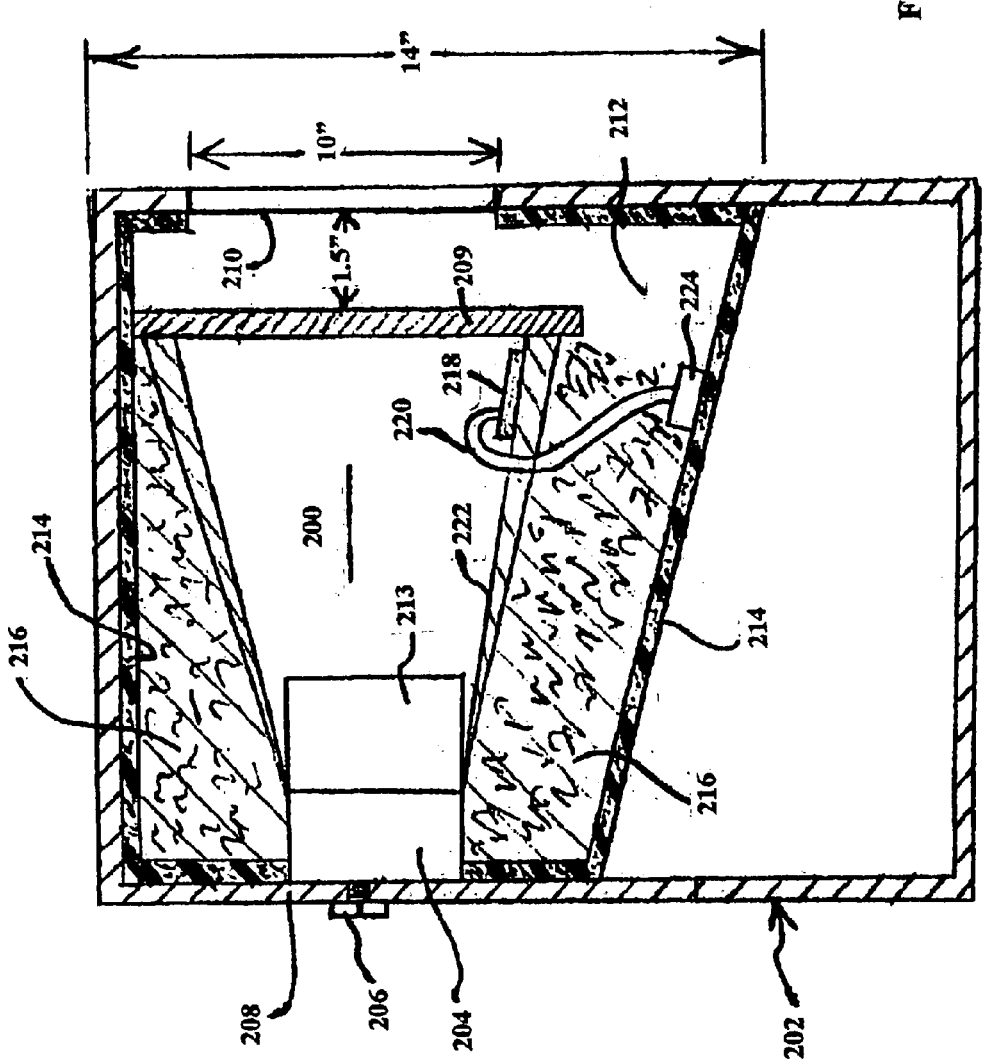
FIG. 28A shows a partial cross sectional view of the mounting of a loudspeaker within an enclosure for floating the cone of the speaker for one embodiment of the invention.
Figure 28B:
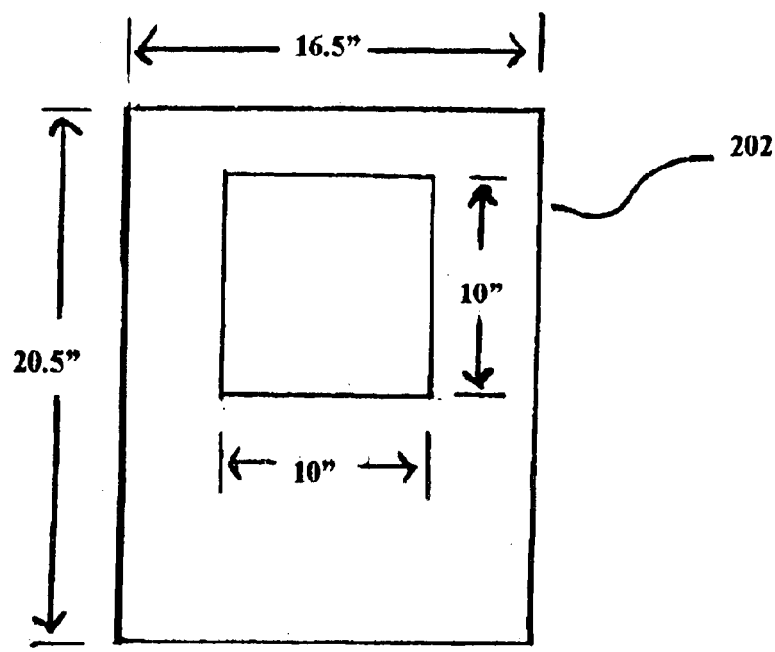
FIG. 28B shows a front elevational view of the speaker enclosure of FIG. 28A.
Figure 28C:
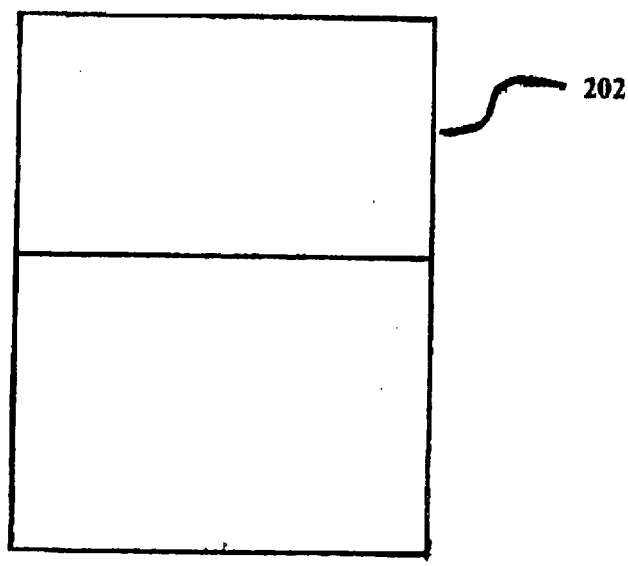
FIG. 28C shows a back elevational view of the speaker enclosure of FIG. 28A.

A twelve inch speaker 200 is placed in a closed-back cabinet 202 (see FIG. 28A, 28B, and 28C). This speaker 200 is fixed only at its rear (magnet) end 204 with a single screw 206 attachment to the rear wall 208 of the cabinet 202. The speaker 200 does not come in contact with the front baffle 210. Thus, it is effectively floating free in the chamber 212. The speaker 200 chosen for this embodiment is an 8 ohm ceramic magnet speaker with 1' voice coil 213. It is of low-to-medium efficiency and exhibits "breakup," or speaker distortion at low sound pressure levels.

The speaker 200 used in an experimental prototype system was an aftermarket (Radio Shack®) replacement speaker #30-1314. Although not available as a new unit, it is available in the vintage market and closely approximates the classic Jensen® C12N in this application. The latter speaker 200 and reproductions such as the Eminence® gold label replacement speakers for the Fender Blues Deluxe® is readily available.

The cabinet 202 dimensions have been chosen to minimize feedback. Foam material 214 is adhered permanently on all cabinet interior surfaces. Additionally, the cabinet is partially filled with synthetic batting materials 216. This effectively increases the internal surface area and breaks up standing waves. The cabinet 202 is non-ported.

If one were interested in increasing bass response, a larger cabinet plus/minus porting might be used. Additionally, a more efficient speaker 200 with lower frequency response might be a consideration. In the prototype, a single-ended integrated tube amplifier 198 of around 5–8 watts using a single output tube (6V6/6AQ5 or 6L6) or a solid state amplifier 198 up to 20 watts will easily drive the speaker 200 to the desired degree of distortion in the present setting.

An SDT® Shielded Piezo Film Sensors Element 218 with shielded cable 220 available from AMP®, Inc. part # STD1-028K (see FIGS. 5A and 5B) is employed. It is permanently attached to the anterior portion of the speaker cone 222 approximately four inches from the geometric center of the cone 222. The sensor 218 is adhered with cyanoacrylate cement (Crazy Glue®) on its flat surface. The edges are reinforced with fast-setting two part epoxy cement. The wire end of cable 220 of the sensor or transducer 218 is supported in space by anchoring it to the external cardboard lining (not shown) the rim 209 of the speaker 200. There is no encumbrance to speaker travel encountered, as sufficient slack is allowed.

Figure 6:
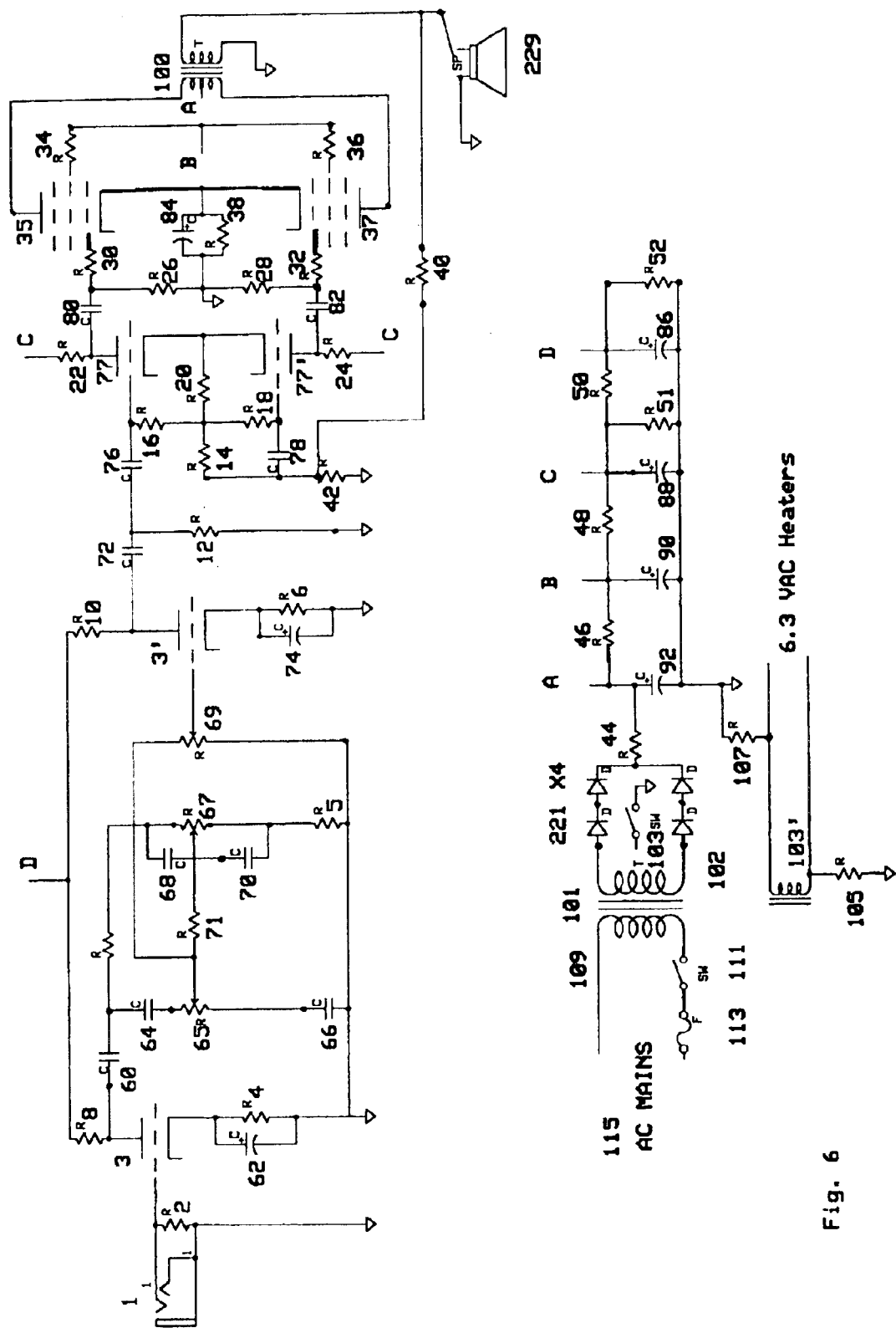
FIG. 6 shows a circuit schematic diagram of a vacuum tube amplifier used in a prototype system for one embodiment of the present invention, with the amplifier including a preamplifier stage driving a power amplifier stage.

The shielded transducer cable 220 is attached to a quarter inch phone jack 224 allowing use of a standard ¼ inch shielded patch cord between the speaker enclosure 202 and the input of a preamplifier 226 driving a power amplifier 228 (See FIG. 4). This patch cord (not shown) is kept as short as possible as it will enter the preamplifier 226 to connect with the grid lead of the preamplifier dual triode 3, 3' (see FIG. 6).

The engineering prototype of the present invention was designed to optimize guitar tonal characteristics. Alternatively, the amplifier and speakers might be redesigned to optimize fidelity of response such as for listening music. Whereas the amplifier stages 226 and 228 described below were expressly designed to highlight distortion of the guitar signal and accentuate tube characteristics throughout the signal chain, the system can be redesigned to optimize clarity and fidelity. This would include changes throughout the circuit from the choice of primary speaker 200 through the second amplifier 228 and preamplifier 226 element values to the modification of any necessary phase splitter and output stages. Additionally, different secondary speaker 229 and choice of speaker enclosure 202 such as bass reflex or multi-section speakers with crossovers might be chosen to improve fidelity.

Amplifier Circuit Description it is recognized that a solid state amplifier can be used in a less preferential mode. For the prototype consisting of a vacuum tube amplifier (See FIG. 6), the rationale for choosing the circuit described herein and the significant component values are noted.

A shielded cable or patch cord (not shown) from the piezo transducer is connected to the preamplifier via connector 1, in this example. The high impedance signal is matched via resistor 2, (10 meg) prior to introduction to the one grid of first preamplifier tube, a dual triode 3, 3' (12AX7). Resistors 4 and 6 for the cathodes have resistance values that were chosen for high gain characteristics. Capacitors 62 and 74 were chosen so that the capacitive reactance (in this example 50 mfd for each) allows passage of desired bass frequencies, in addition to high end frequency.

Resistors 8 and 10 are chosen to provide low voltage (from a 307 VDC supply in this example) to the plates of both halves 3, 3' of the dual triode. Through trial and error experimentation, it was learned that these plate values result in optimum transfer of the tonal characteristics of the input signal. Capacitors 60 and 72 are interstage decoupling capacitors and are of standard value. Capacitors 64,66,68, and 70 are chosen to provide the desired bass and treble rolloff in a Baxandall type tone stack. This flat response tone stack with modified roll off has been found to provide the optimum match to the piezo transducer 218 coupled to the first speaker 200. Capacitors 86, 88, 90, and 92 are AC bypass capacitors or filter capacitors for various dc plate and grid voltages. A resistor 50 is connected between resistor 51 and the common connection of resistor 52 and capacitor 86. Potentiometers 65, 67, and 69 (each a megohm in value, in this example) are connected as shown to provide treble, bass, and volume controls, respectively. A coupling resistor 71 is connected between the wiper of potentiometers 65 and 67, and the wiper of potentiometer 65 is connected to one end of potentiometer 69.

Resistor 40 is connected from the secondary of output transformer 100 to the common connection of resistors 14 and 42, and capacitor 78. AC coupling capacitor 72 is connected from the common connection of resistor 10 and the plate of triode section 3', to the common connection of resistor 10 and the plate of capacitor 76. Resistors 14, 16, 18, and 20 are connected between triode sections 77 and 77'.

Resistor 12 attenuates the signal prior to entry into the long tail pair phase splitter at the input capacitor, 76. This phase splitter was chosen for its characteristic high gain. A 12AU7 dual triode 77, and 77' is run at typical plate voltage values. It should be noted that 310 volts DC is provided to resistors 22 and 24 to optimize headroom. Capacitors 80 and 82 are interstage decoupling capacitors. The value of each was chosen to optimize bass response.

The power section is a modified Williamson cathode-bias type arrangement where the screens are connected to ground through resistors 26, 30, 28, and 32. Plate voltages are relatively high for the 5881 tubes 35 and 37; the bias is via common cathode resistor 38. The value of 600 ohms was chosen to allow the tubes to idle at cathode current of thirty eight milliamperes, in this example. The bypass capacitor 84 value was chosen to allow for some transient bias shift. An output transformer 100 capable of sixty watts was utilized. Resistors 34 and 36 are connected in series between grids of vacuum tubes 35 and 37, with the common connection of the grids being connected to the common connection of resistors 46 and 48 with capacitor 90. The other end of resistor 46 is connected in common to the centertap of the primary winding of transformer 100, capacitor 92, and one end of resistor 44. Rectifier diodes 221 are connected between a secondary winding 102 of power transformer 101 and the other end of resistor 44. Resistor 44 is 220 ohms in this example. A standby switch 103 is connected between the centertap of winding 102 and a source of reference potential, ground in this example. A second secondary winding 103 has its leads connected through resistors 105 and 107 to ground, and provides 6.3 VAC heater voltage. The primary winding 109 of transformer 101 is connected through power switch 111 and fuse 113, via plug 115, to an standard 110 VAC supply.

The output leads of the piezoelectric film sensor 218 are fed to the input of the secondary amplifier 500 with characteristics chosen to faithfully reproduce the incoming signal without significant alteration. Overall volume level of the system is determined by this secondary amplifier 500. Commonly available types for this stage include acoustic guitar amplifiers, bass, keyboard amplifiers, and public address amplifiers.

The invention is designed to capitalize on the response characteristics of a piezo film transducer 218 when tightly coupled to a speaker cone 222. In the summary of operating properties of the AMP®, Inc. Piezo Film Sensors Product Guide (Catalog 65711, Revised September 1995), it is presented that these devices can be used for electrical to mechanical conversion, mechanical to electrical conversion, and pyro to electrical conversion. Piezo pickups have been used with acoustic guitars, and it is generally recognized that string pressure applied to the contact pick up generates a varying current output from the pickup. The piezo pickups have very high impedance at low frequencies and approach zero impedance at high frequencies. This has been problematic for designers of equalization systems for piezo contact pickups.

The inventor recognizes the frequency dependent mechanical to electrical energy transfer curves for piezo sensors and has employed this to advantage in the current invention. A piezo film sensor 218 is tightly coupled to a speaker 200. The fundamental waveform and harmonics produced by the DUT including speaker 200 is transduced into an electrical signal. The tight coupling of the contact sensor 218 to the speaker cone 222 allows for superior transference of the harmonics, along with a more rapid response to the higher frequency harmonics associated with lower frequency notes than to the lower frequency notes themselves.

A microphone (not shown) placed at a distance from the speaker 200 will demonstrate transfer of energy and a transduced signal attenuated by passage through air. A microphone does not exhibit the same impedance characteristics to low frequencies as demonstrated by the piezo contact sensor 218 directly coupled to the speaker cone 222.

The foregoing discussion is supported by waveform analysis (See FIGS. 7–27). Using a sine wave signal generator (not shown), frequencies between 60 Hertz and 900 Hertz applied to the Primary Amplifier 198 were analyzed before the piezo-speaker 200, 218 interface and immediately following the piezo-speaker 200, 218 interface.

The waveform was also analyzed at the output of the second amplifier 500. Experimental observation indicates that the second amplifier design permits faithful reproduction of the signal generated at the piezo-sensor -speaker interface and presents a higher amplitude of the signal presented to it.

Figure 7:
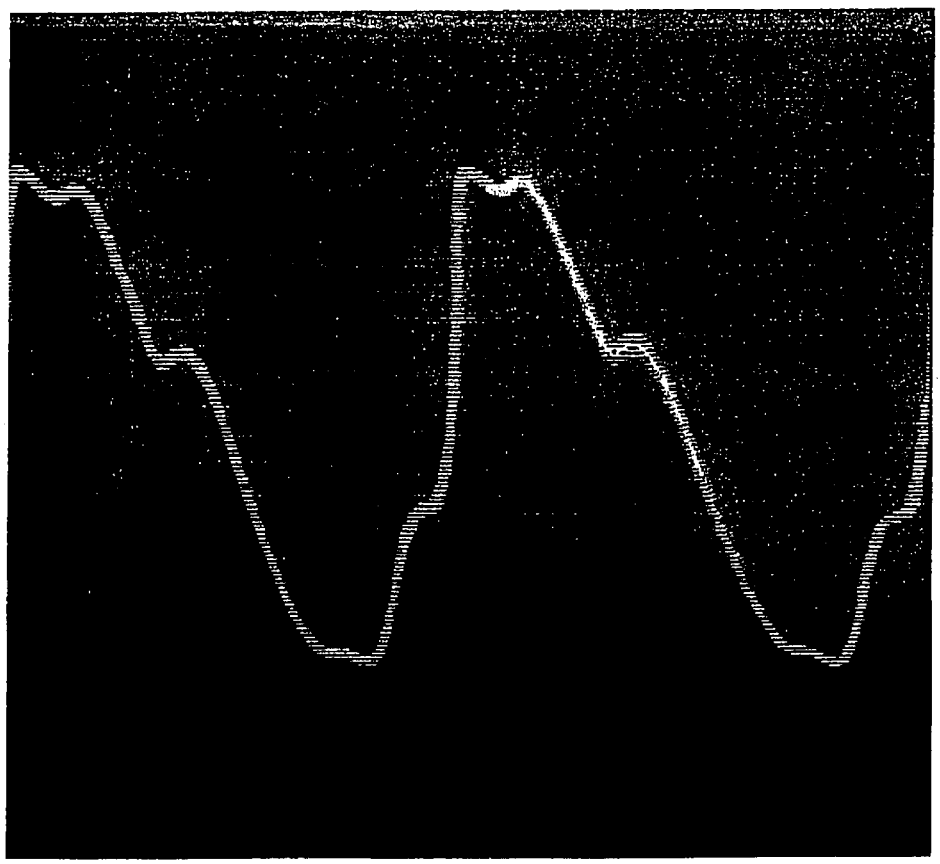
FIGS. 7 through 27 show oscilloscope photographs of waveforms obtained at the output terminals of a first amplifier amplifying the initially obtained electrical audio signal from an audio source, and waveforms obtained at the output terminals of a second amplifier in a prototype system used to amplify the electrical audio signals obtained from a piezo transducer.

FIGS. 7 through 27 show oscilloscope photographs of waveform obtained at the output terminals of a first amplifier 198 amplifying the initially obtained electrical audio signal from an audio source, and waveforms obtained at the output terminals of a second amplifier 228 in a prototype system used to amplify the electrical audio signals obtained from the piezo transducer 218. FIG. 7 shows a 60 Hertz distorted sine wave at the output of the second amplifier 228, which waveform is the amplified electrical audio signal from the piezo transducer 218 on the cone of the loudspeaker 200 being driven by the first amplifier 198.

Figure 8:
Figure 9:
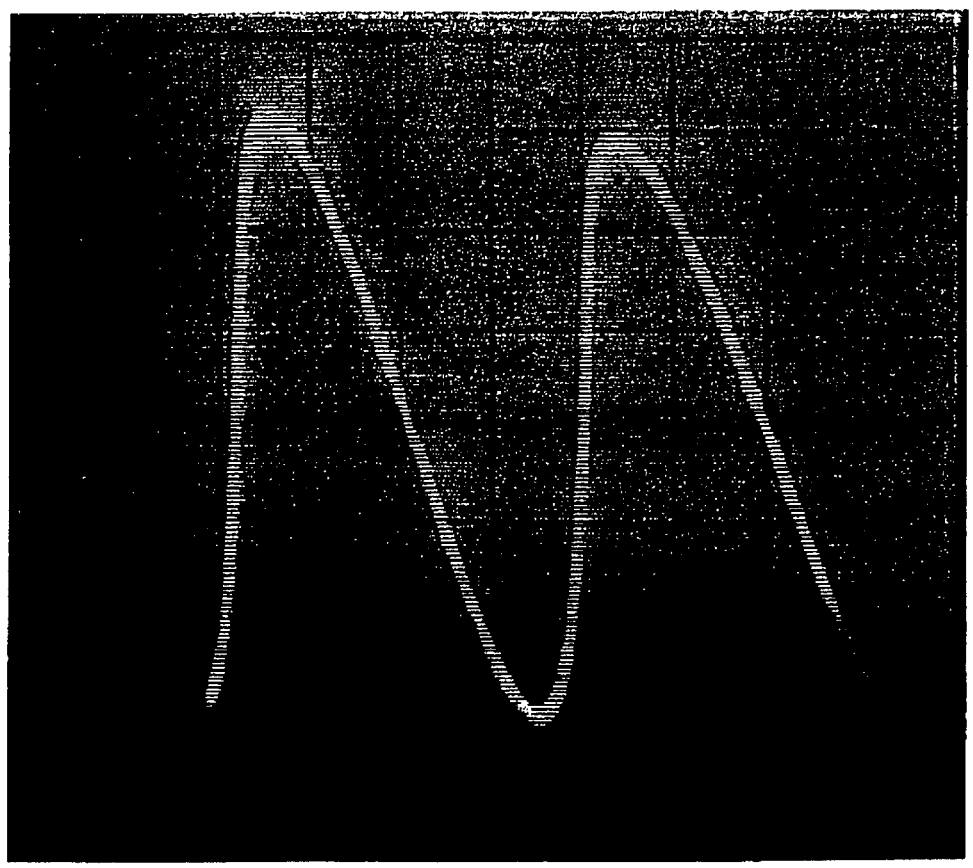

FIGS. 9 shows the sine wave applied to the input of the first amplifier 198, before being distorted by the first amplifier 198 to produce the distorted sine wave of FIG. 8.

Figure 10:
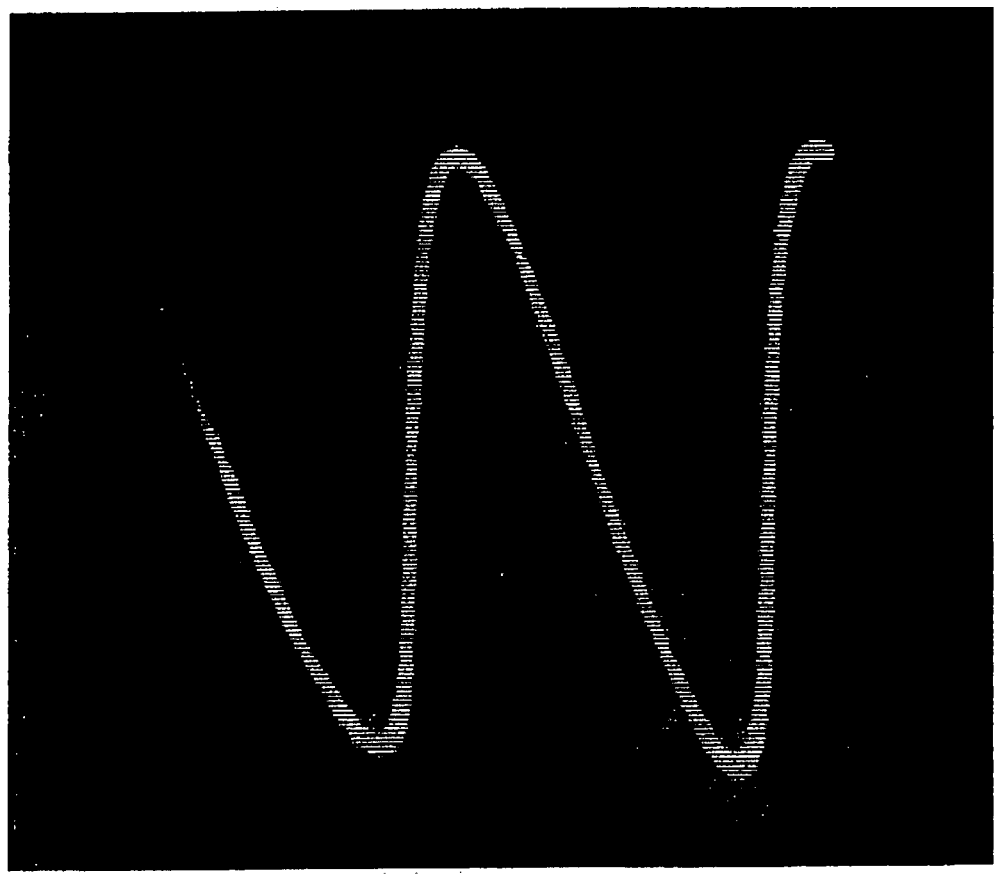
Figure 11:
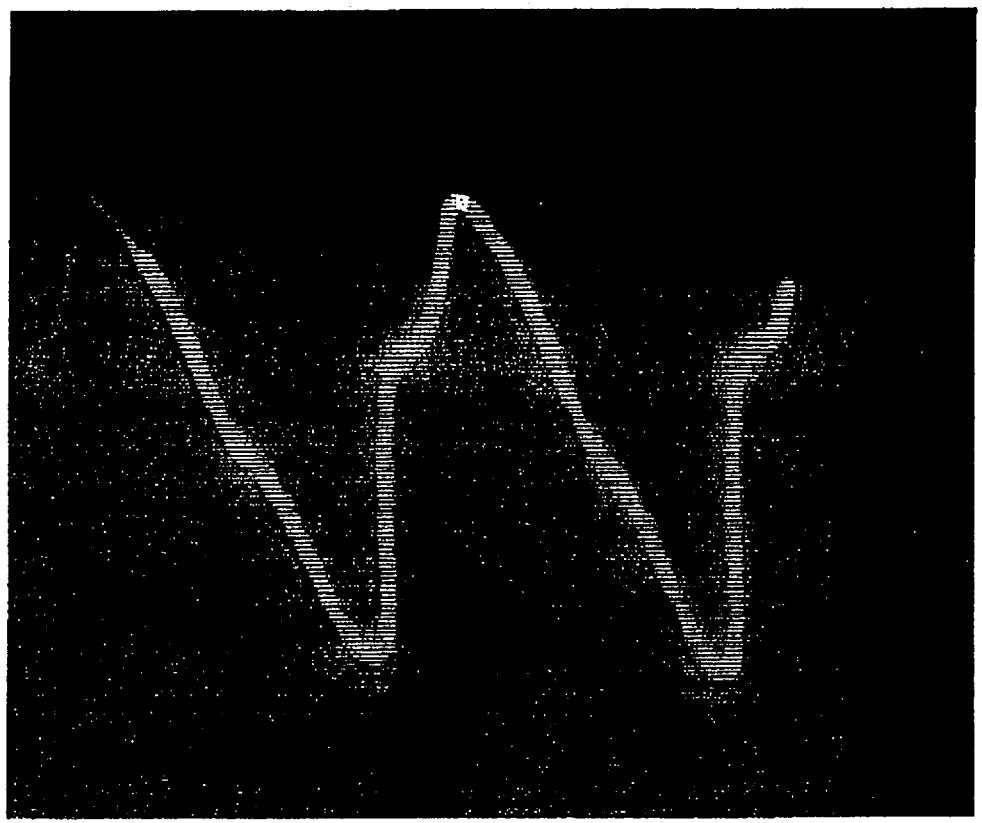

FIG. 10 shows a 100 Hertz sine wave applied to the input of the first amplifier 198. FIG. 11 shows the 100 Hertz sine wave of FIG. 10 after being distorted, and as appearing at the output of the second amplifier 228.

Figure 12:
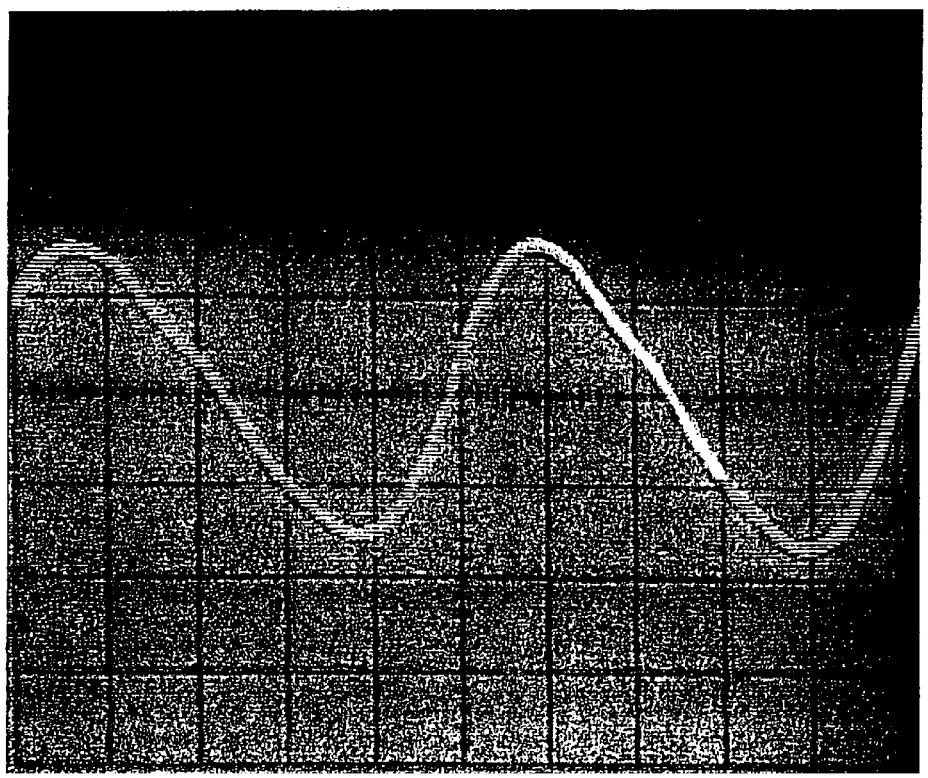

FIG. 12 shows a sine wave input signal applied to the first amplifier 198 which resulted in the distorted sine wave of FIG. 8, appearing at the output of amplifier 228.

Figure 13:
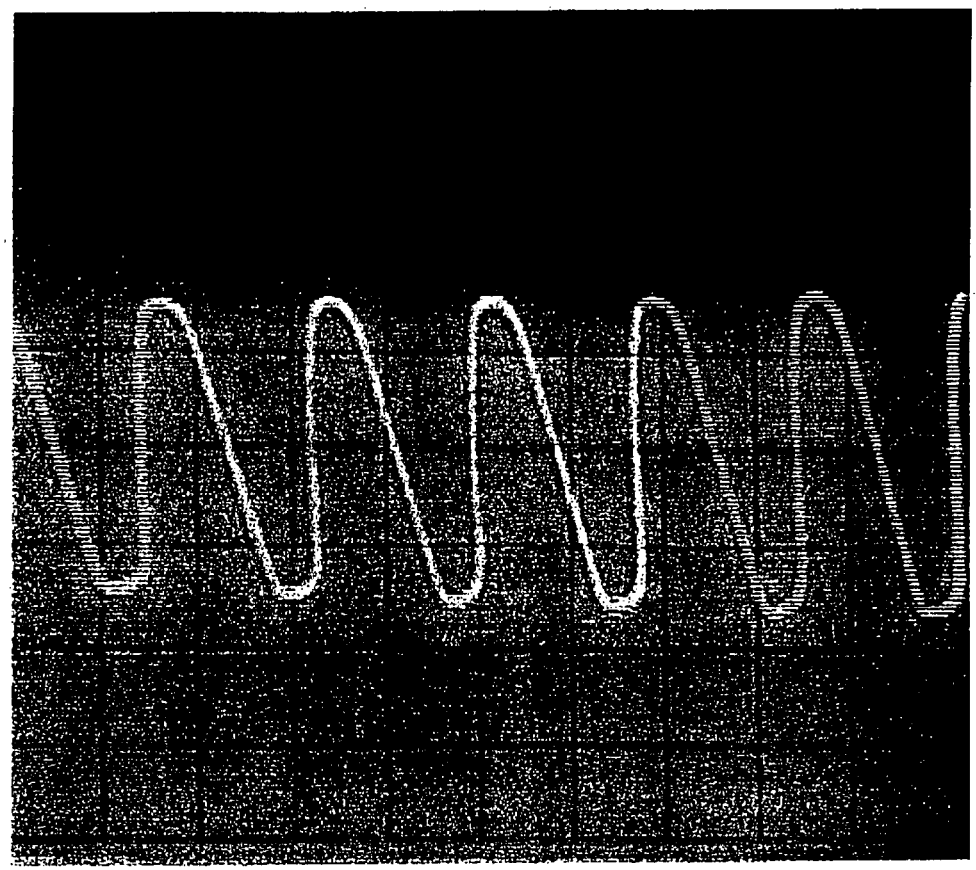
Figure 14:
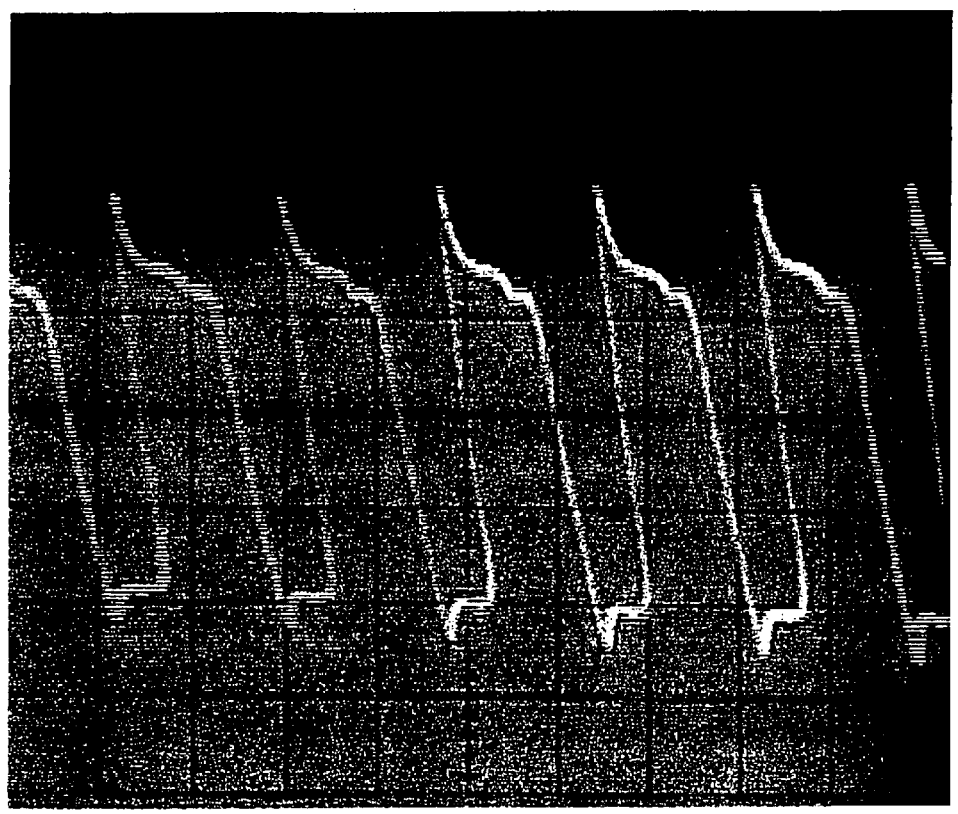

FIG. 13 shows a guitar note as applied to the input of the first amplifier 198. FIG. 14 shows the electrical audio signal for the guitar note of FIG. 13, as detected by the piezo transducer and amplified through the second amplifier 228.

Figure 15:
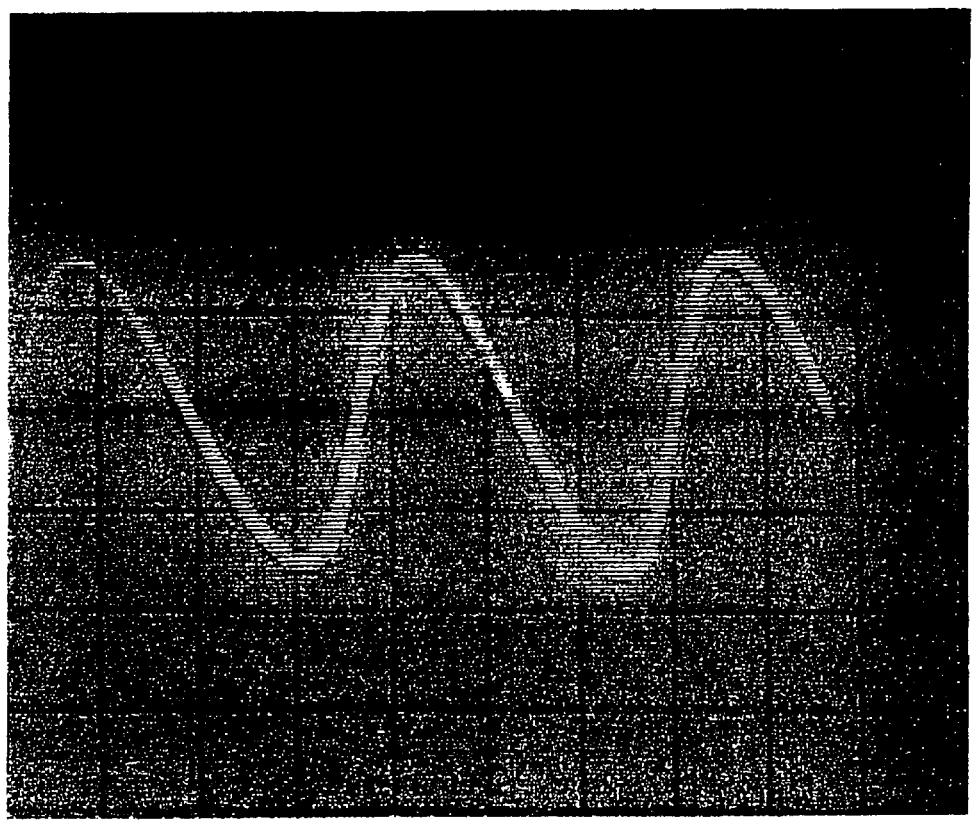
Figure 16:
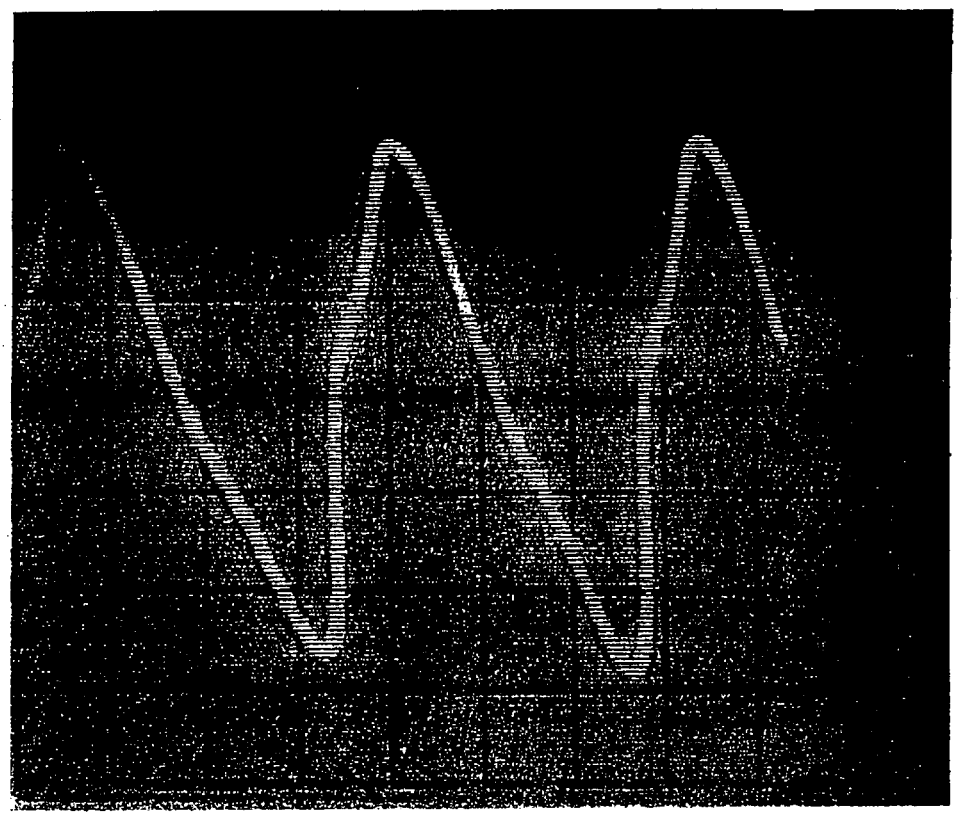
Figure 17:
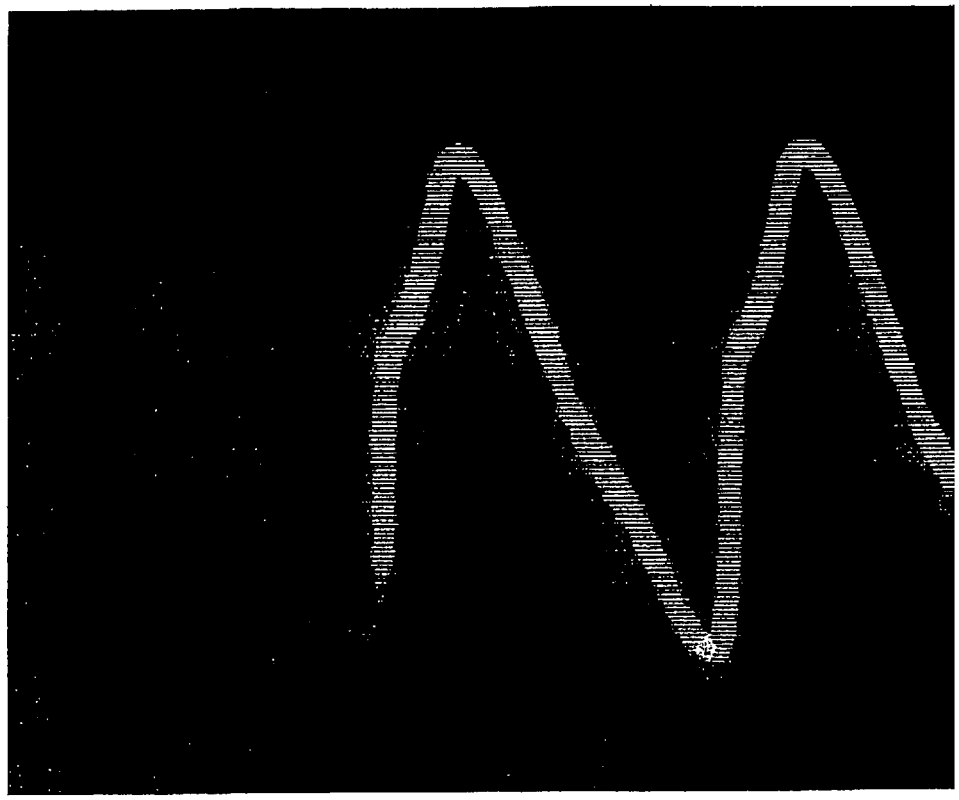
Figure 18:
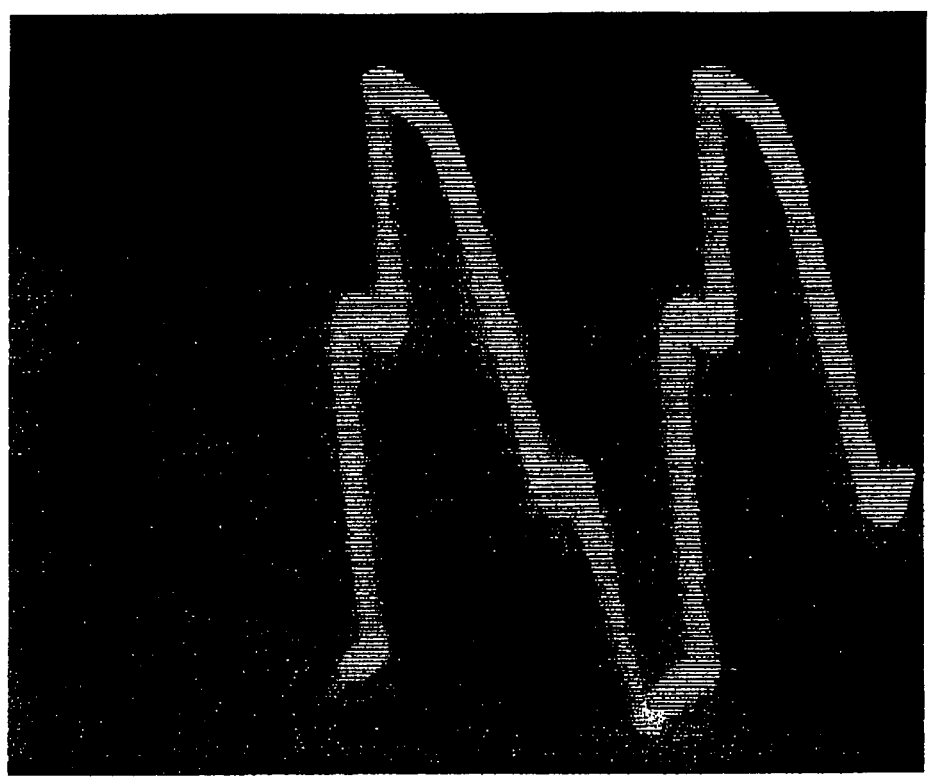
Figure 19:
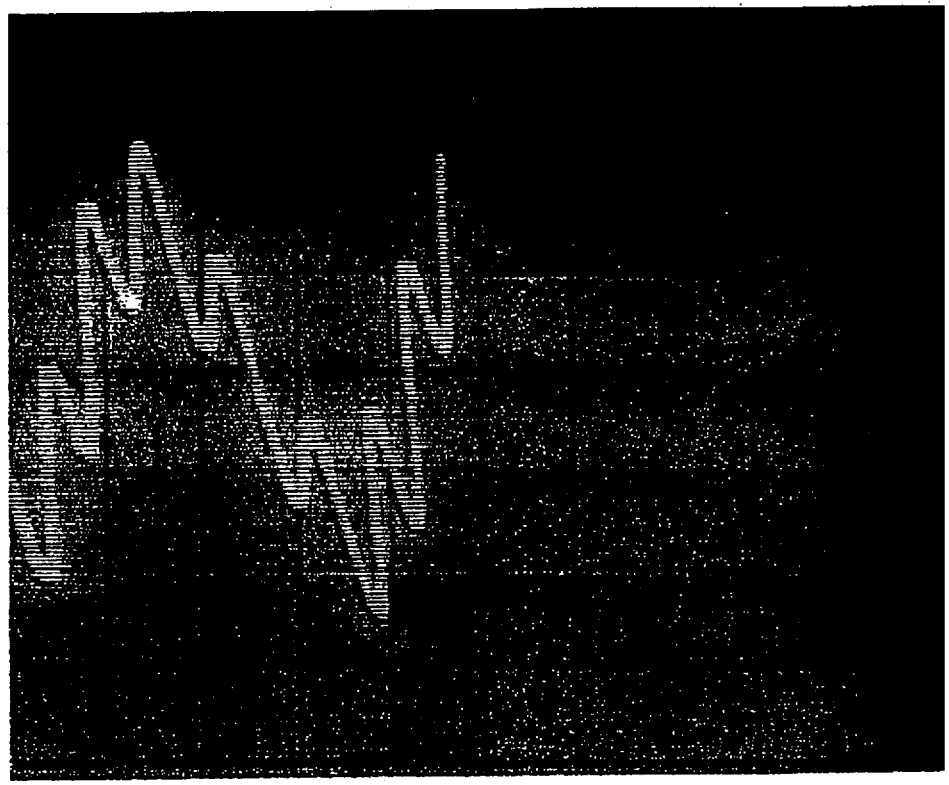
Figure 20:
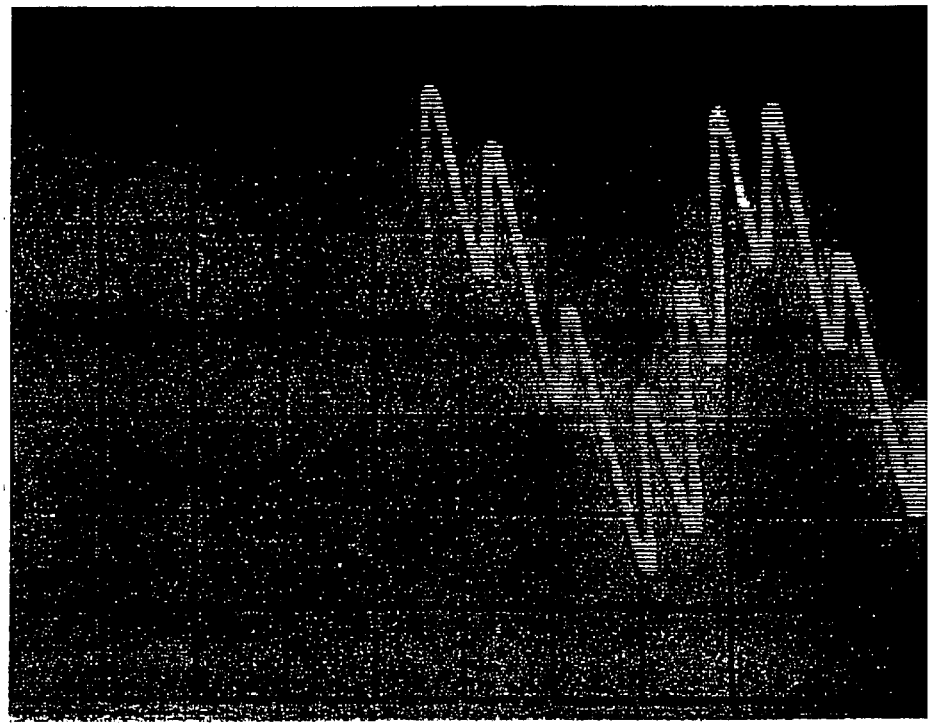
Figure 21:
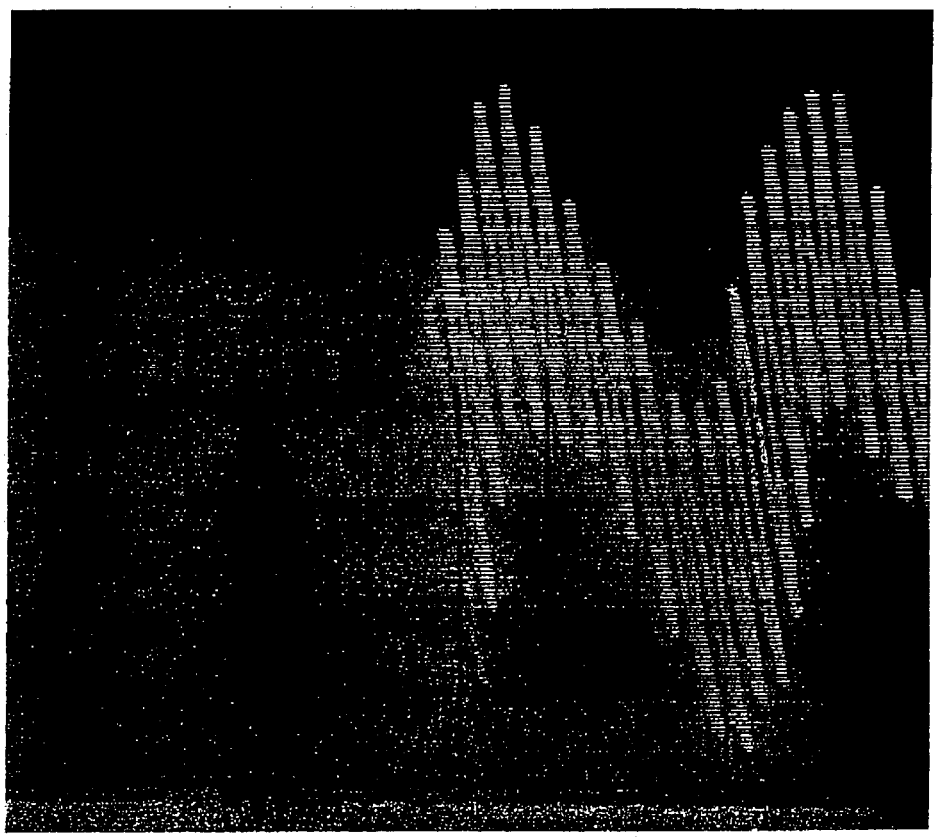
Figure 22:
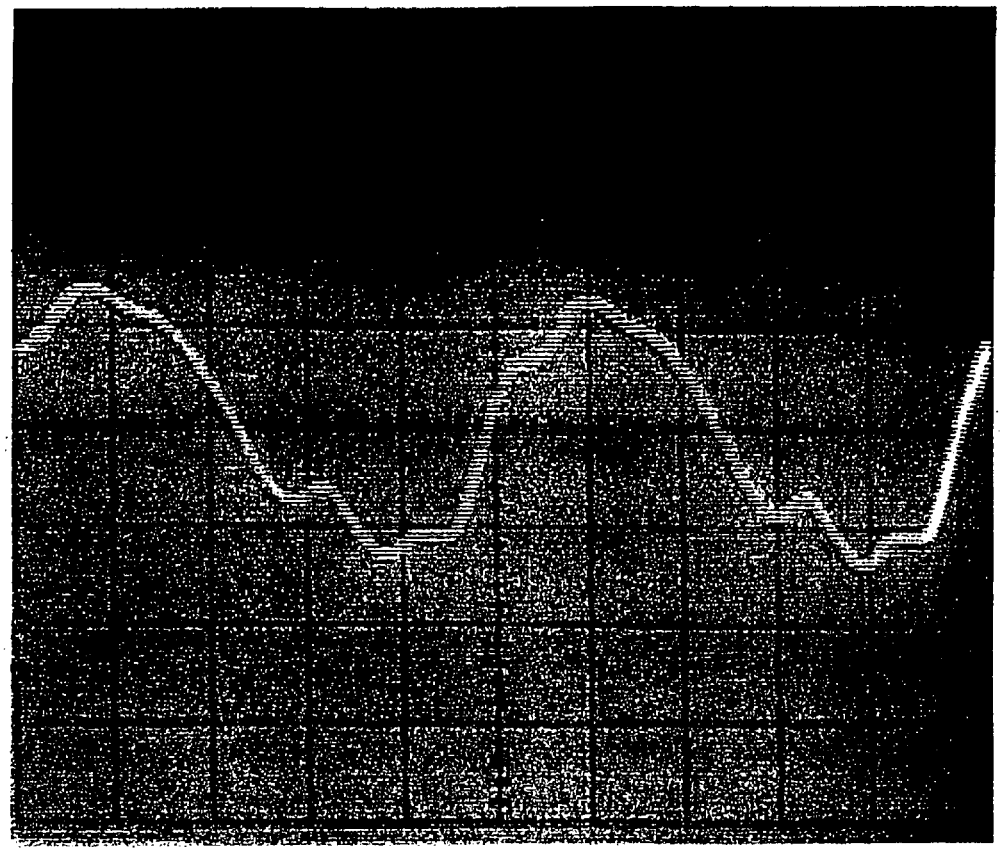
Figure 23:
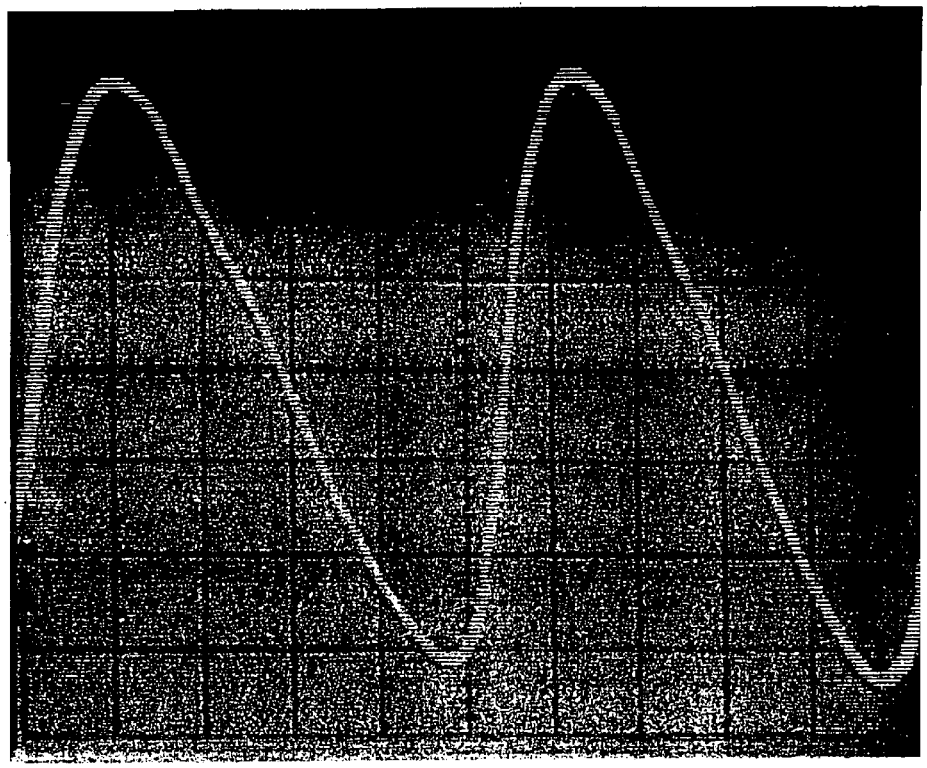
Figure 24:
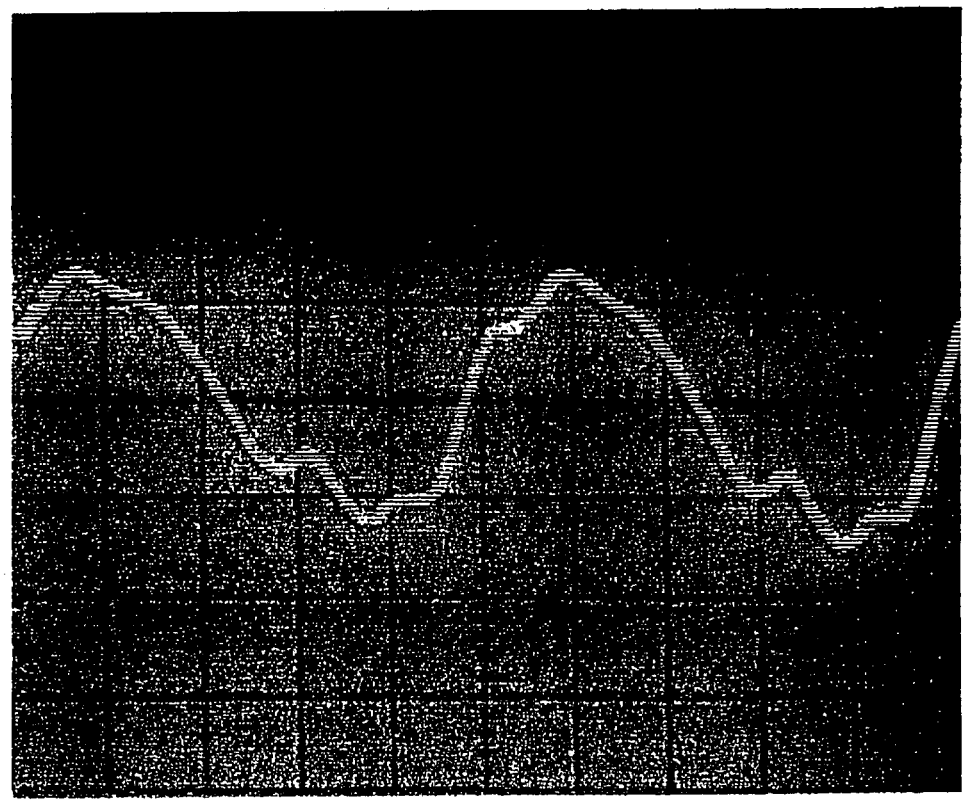
Figure 25:
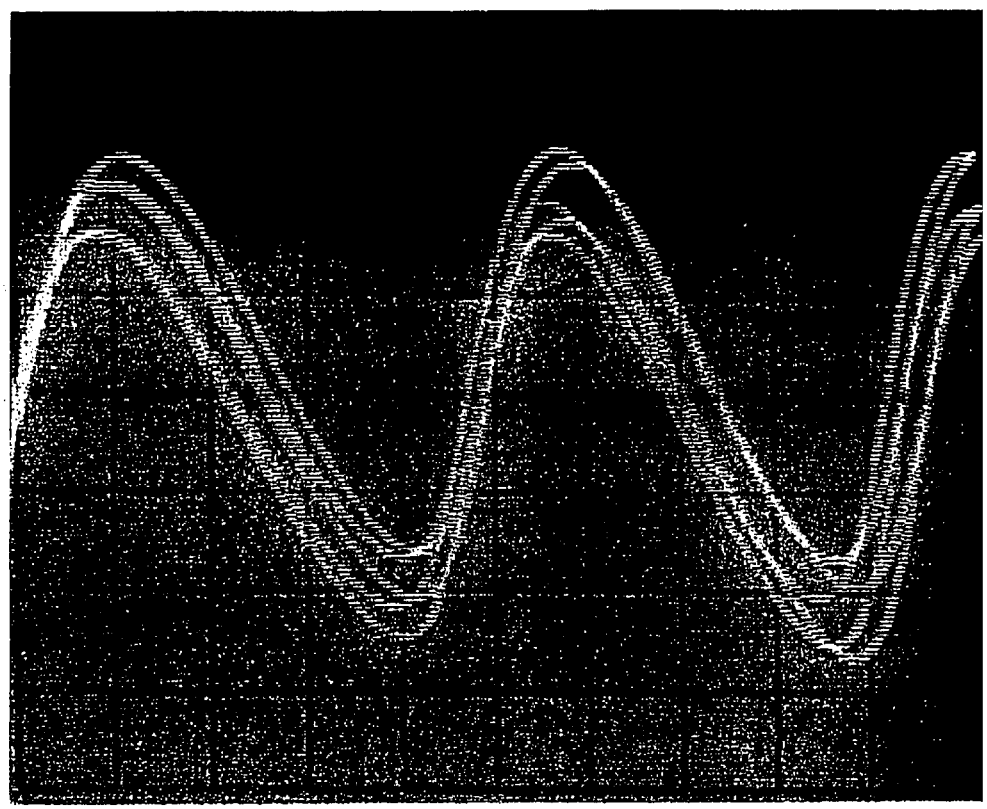
Figure 26:
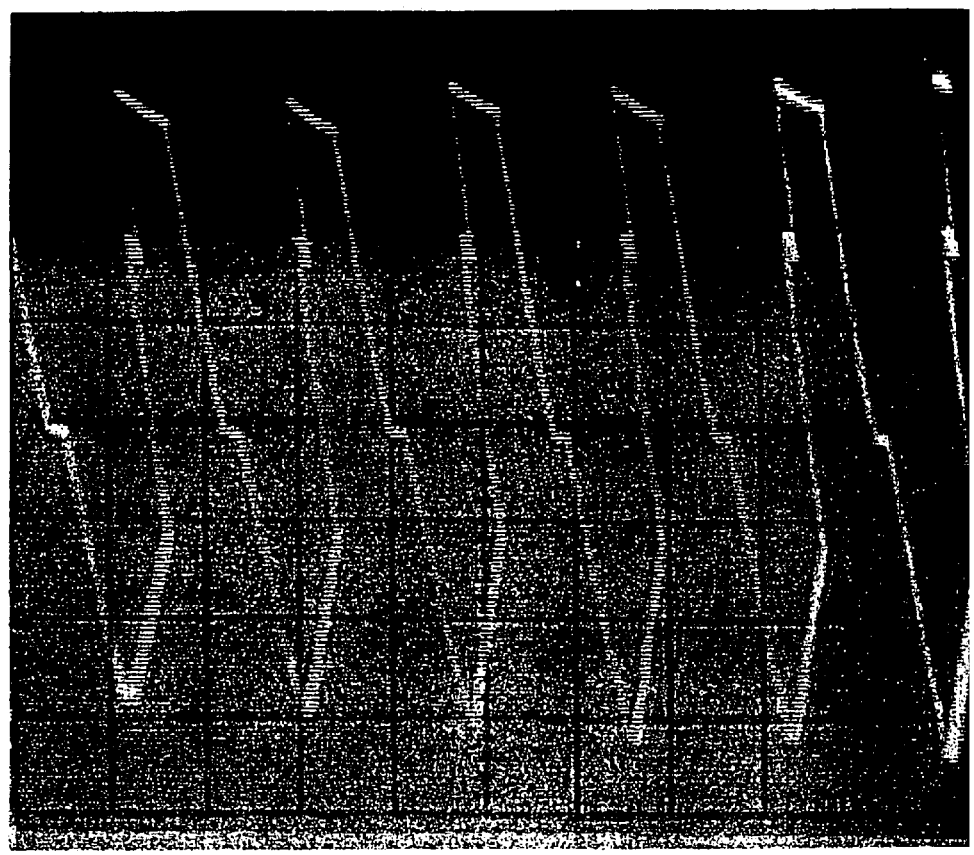
Figure 27:
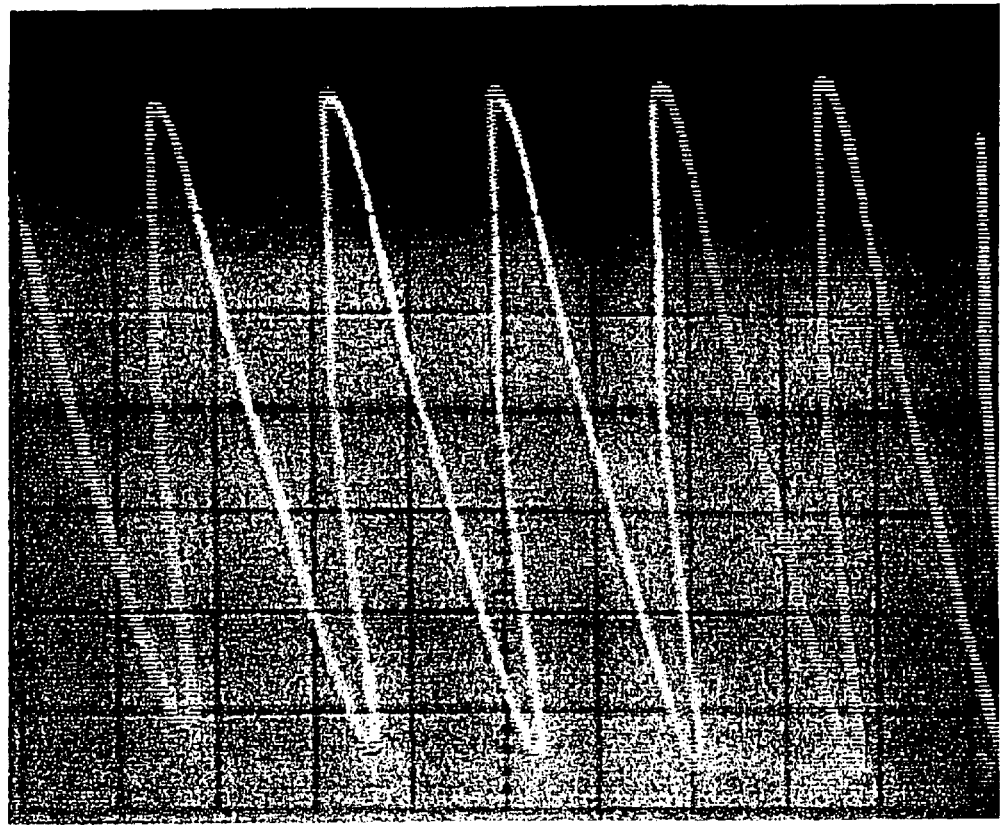

FIG. 15 shows a sine wave applied to the input of the first amplifier 198. FIG. 16 shows the result and distorted sine wave at the output of the second amplifier 228 as derived from the sine wave input of FIG. 15.

It is the inventor's interpretation of these results that the system has preferentially selected even order harmonics; there is some contribution from odd order harmonics. The waveform produced following the piezo-speaker interface is neither a characteristic Fourier transform to a square wave (which would indicate odd order harmonics) or a transform to a sawtooth wave which would indicate even order harmonics. There is a waveform generated which is atypical, containing both odd and even order harmonics with an apparent favoring of even order. The effect of this interface is believed to be due to the differential response of the transducer to low vs. high frequencies, the selection of higher order harmonics early on in the signal, and the capture of harmonics produced by the physical movement of the cone 222.

The effect is more pronounced at lower frequencies; it is present to a lesser extent at higher frequencies. The frequencies examined cover those of the fundamental notes of the 3 plus octave range of the standard-tuning guitar. It is recognized that the guitar signal presents a complex waveform which stabilizes to a sine wave with long sustain and slow decay envelope.

The invention is better than existing approaches for obtaining optimum electric guitar tone from several perspectives. Whereas it is generally agreed that the gold standard is a "cranked" tube preamplifier/power amplifier/speaker signal chain; tube technology is antiquated. Vacuum tube amplifiers are more expensive to manufacture than solid-state amplifiers, even with modem methods (Printed Circuit Board rather than point-to-point or tagboard/eyelet). Tubes may face extinction as demand for tubes in areas other than musical instrument amplification diminishes. Because tubes are a consumable, tube amplifiers may eventually become obsolete.

Solid state designs have not met with general approval to date because their tone as a stand-alone does not compare with that of tubes. However, when coupled with the invention described herein, the tone, attack envelope and resonance characteristics of an overdriven solid state amplifier very closely simulate the gold standard. It appears that coupling of a piezo contact transducer to the primary speaker and subsequent amplification of this signal results in harmonics similar to that generated by the traditional overdriven tube amplifier. The invention described herein allows modem total solid state design with its attendant advantages to replace the tube amplifier.

Because the desired tone can be developed at lower volume levels and subsequently reamplified to match room acoustics, there is no longer a necessity for high sound pressure levels based on tonal considerations. This will permit the development of proper sounding practice amplifiers, allowing the electric guitarist to enjoy the characteristic tones of his instrument at the same volume an acoustic guitarist might play. Lower sound pressure levels for rehearsal, recording, and on-stage will promote hearing conservation and help minimize occupational and avocational hearing loss. The system can be packaged in simple self-contained units, permitting design improvements to maximize flexibility and consumer acceptability.

Figure 29:
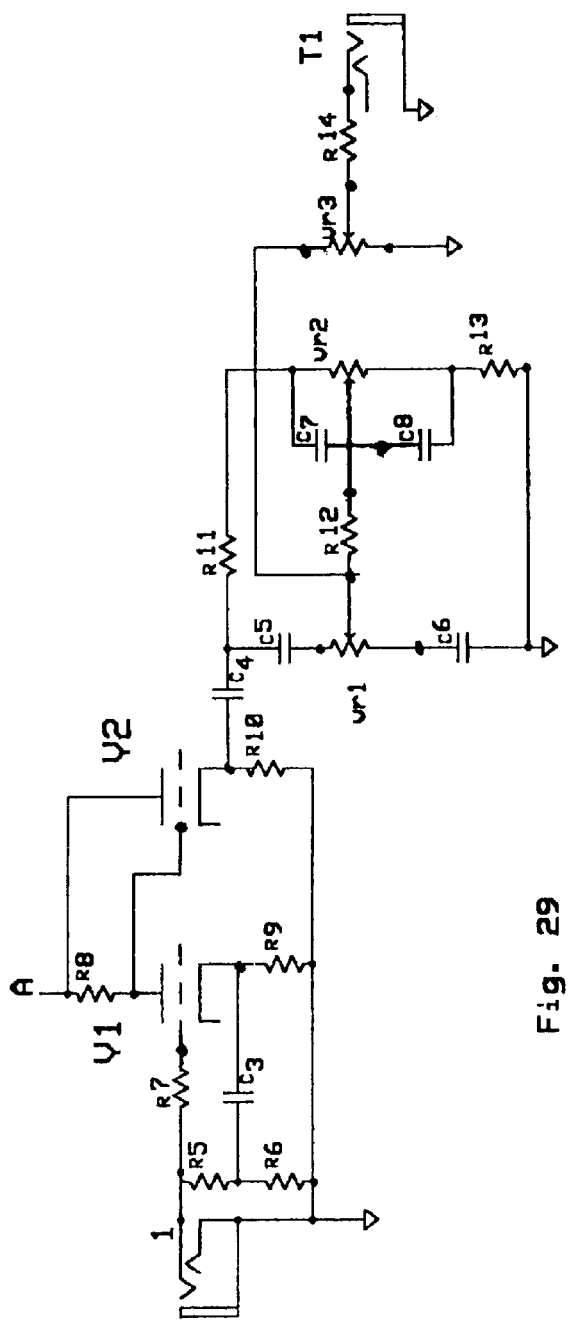
FIG. 29 shows a preamplifier circuit for another embodiment of the invention.
Figure 30:
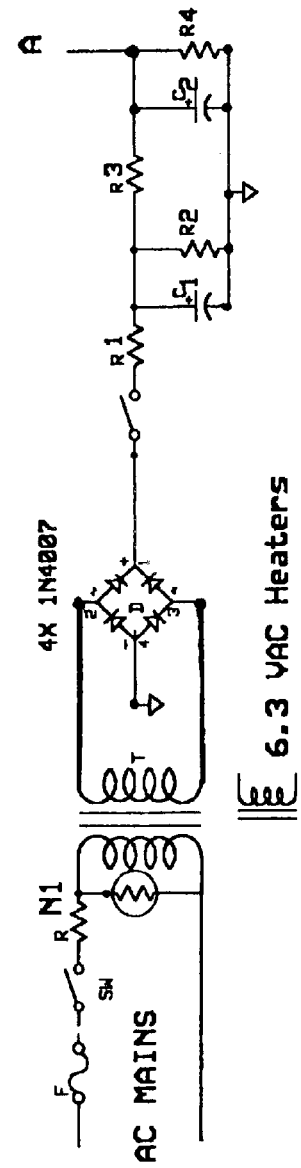
FIG. 30 shows a power supply for the preamplifier circuit of FIG. 29.

In another embodiment of the invention, the integrated amplifier consisting of preamplifier 226 and power amplifier 228 can be replaced with any standard integrated musical instrument or public address amplifier, through use of the matching buffer preamplifier circuit of FIG. 29, powered by a 245 volt DC supply. The 245 volt DC supply can be provided by the power supply circuit of FIG. 30, if desired. As shown in FIG. 29, the matching preamplifier design includes resistors R5 through R14, capacitors C3 through C8, variable resistors VR1 through VR3, connector 1, a dual triode vacuum tube V1, and an output terminal T1, respectively, interconnected as shown. The associated power supply of FIG. 30 includes capacitors C1 and C2, resistors R1 through R4, single-pole-single-throw switches S1 and S2, a transformer W1, a neon power indicator N1 amplifier, a fuse F1, and an AC plug P1, respectively, interconnected as shown. In an engineering prototype, resistor R1 was 6.8 k (kilo ohms); R2, R4, R8, and R14 each were 220 k; R3 was 10 k; R5 and R6 were each 1 megohm; R7 was 22 k; R9 was 4.7 k; R10 was 56 k; R11 was 330 k; R12 was 120 k; and R13 was 47 k. Variable resistors VR1, VR2, and VR3, were each 1 megohm audio variable resistors. Capacitors C1 and C3 were each 22 microfarads; capacitor C2 was 10 microfarads; capacitor C4 was 0.1 microfarads; capacitor C5 was 470 picofarads; capacitor C6 was 0.0047 microfarad; capacitor C7 was 0.001 microfarad; and capacitor C8 was 0.01 microfarads. The dual triode vacuum tube V1 was a 12AX7 dual triode. It is preferred that the fuse F1 be a slow blow fuse. Also, diodes D1 through D4 were each diode type 1N4007, respectively.

As indicated, the stand-alone preamplifier of FIG. 29 was developed to interface with the speaker/piezo transducer unit 200, 218 to a standard guitar or PA amplifier. With the power supply of FIG. 30, the preamplifier is self contained, and provides enhanced ergonomics and improved flexibility to a user.

The circuit employs two cathode followers. The effective input impedance at the grid of the first triode of V1 is maximized to match the high impedance (5–15 megohms) of the piezo transducer 218. This is accomplished through use of the bootstrap capacitor C3 between the grid of the first triode section and the cathode of the first triode section. The signal is taken from the plate of the first triode and applied to the grid of the second triode section of V1.

A second cathode follower stage involves tapping the signal from the cathode of the second triode and applying it through DC blocking capacitor C4 to a typical Baxendall-type tone stack BTS. The rationale for the second cathode follower is to optimize impedance matching to the input of the tone stack BTS. The signal is then handled as a preamplifier signal through a "master volume" set up through a variable resistor VR3 and R14. The voltage divider formed by the variable resistor VR3 and the 220K resistor R14 allows recovery of bass response prior to applying the signal to the input stage of a typical commercially available PA or guitar amplifier via output terminal T1. Rather than providing voltage gain, the dual cathode follower circuit allows for optimal audible frequency response matching of the speaker/piezo unit 200,218 to commercially available PA or guitar amplifiers.

As a stand-alone, this combination of speaker/piezo transducer 200,218 and preamplifier circuit provides superior performance to the line-out, power attenuator, or direct-boxes approaches. None of these commercial units permit recovery of the audio signal with its attendant harmonic spectrum at the locus of the overdriven speaker.

As a stand alone preamplifier unit, this module permits the user to easily select between piezo transducer/speaker 200, 218 combinations and secondary amplifier combinations to permit matching of tonal characteristics and decibel levels to room acoustics and dimensions.

The piezo preamplifier section also permits the interface, via tube circuitry, of a piezo acoustic musical instrument transducer to commercially available amplifiers. For example, connecting the output of a piezoelectric sensor of a violin to a commercial amplifier.

The preamplifier of FIG. 29 is unique in its application of dual cathode follower networks. The incoming voltage to the anodes of both halves of the dual triode and the voltage at both cathodes is typical. The power supply of FIG. 30 simply delivers the required voltage to these points. The cathode resistors R9 and R10 have been chosen through experimentation to optimize the triode's current draw for the particular positions of the circuit.

Although various embodiments of the invention have been shown and described, they are not meant to be limiting. Those of skill in the art may recognize certain modifications to these embodiments, which modifications are meant to be covered by the spirit and scope of the claims appended hereto. For example, although the invention is mainly described in association with an electric guitar, it is not meant to be so limited, and is applicable for use in any audio signal amplification system for enhancing the sound produced, including solid-state amplification systems. Also, in another embodiment, the desired distortion of the audio signal can be made to occur other than by overdriving speaker 200, for example, by designing either one or the combination of preamplification 226 and power amplifier 228 to distort the signal in a desired manner.

What I claim is:

1. A system for enhancing the amplification and reproduction of audio signals comprising:
 a source of electrical audio signals;
 a first amplifier for receiving and amplifying said electrical audio signals;
 a first loudspeaker for receiving said amplified electrical audio signals and converting the same into first sound signals, said first loudspeaker including a cone, and a rear cone driving portion including a stationary magnet, and a voice coil connected to said cone;

a piezo film transducer attached to a portion of the cone of said first loudspeaker for producing cone vibration electrical signals corresponding to the waveform of the first sound signals emitted from said cone;

a second amplifier for receiving and amplifying said cone vibration electrical signals; and a second loudspeaker for receiving and converting said cone vibration electrical signals into second sound signals;

said second amplifier including means for both phase inverting said cone vibration electrical signals, and for selectively controlling the high and low frequency rolloff, respectively, for adjusting the sound output of said system to the acoustical characteristics of a room in which said system is operating in accordance to the preference of a listener, said system operating to permit tone generation to be independent of volume levels;

means for driving said first amplifier and first loudspeaker to a level of distortion for obtaining a desired tonal quality at relatively low ambient sound pressure levels; and said second amplifier having a flat frequency response over at least a frequency range of signals received from said piezo film transducer.

2. The system of claim 1, further including:

a first loudspeaker cabinet that includes a sealed back portion and an open front portion for permitting sound waves from said first loudspeaker to be emitted therefrom, and acoustic dampening for minimizing standing waves; and said first loudspeaker being mounted inside said first speaker cabinet in a manner floating the cone thereof.

3. The system of claim 1, wherein said piezo film transducer is radio frequency (rf) shielded, and connected to said second amplifier via an rf coaxial cable.

4. The system of claim 1, wherein said source of electrical audio signals consists of an electric guitar.

5. The system of claim 4, wherein said second amplifier consists of a vacuum tube amplifier for obtaining optimal tonal quality for the sound produced by said system.

6. The system of claim 4, wherein said piezo film transducer is rf shielded, and connected to said second amplifier via an rf coaxial cable.

7. The system of claim 5, wherein said second amplifier includes:

a preamplifier including at least ten megohm input impedance, lower plate voltage than the rated plate voltage of all vacuum tubes therein, the latter having high gain cathodes, a Baxendall-type tonestack with rolloff adjusted to match the combination of said first amplifier and first loudspeaker with said piezo transducer to the combination of said second amplifier and second loudspeaker to obtain a desired sound output; and an output stage including a long-tailed pair phase splitter circuit for high gain and passage of harmonic distortion.

8. The system of claim 1, wherein said piezo film transducer is rf shielded, and connected to said second amplifier via an rf coaxial cable.

9. In an audio system, a method for amplifying electrical audio signals from a sound source in a manner to obtain desired tonal quality at relatively low sound pressure levels with acceptable volume in the reproduced sound to minimize potential hearing loss to a listener, said method comprising the steps of:

obtaining a source of electrical audio signals;

amplifying with a first audio amplifier said electrical audio signals;

applying an audio output from said first audio amplifier to a first loudspeaker including a cone and cone driving mechanism, for producing first sound signals;

attaching a piezo film transducer to a portion of the cone of said first loudspeaker, for obtaining from said transducer cone vibration electrical signals corresponding to the waveform of said first sound signals;

amplifying via a second audio amplifier said cone vibration electrical signals;

applying an output from said second audio amplifier to a second loudspeaker;

adjusting the high and low frequency rolloff of said second audio amplifier to obtain a desired tonal quality in the sound produced by said first and second loudspeakers; and adjusting the output level of said first and second audio amplifiers to a desired level matching the acoustics of a room in which said audio system is operating.

10. The method of claim 9, further including the step of overdriving said first audio amplifier and first loudspeaker to obtain a desired tonal effect on the sound outputted from said first and second loudspeakers.

11. The method of claim 9, wherein said second audio amplifier is a vacuum tube amplifier.

12. The method of claim 10, wherein said second audio amplifier is a vacuum tube amplifier.

13. The method of claim 9, further including the steps of:

rf shielding said piezo film transducer; and connecting an rf coaxial cable between output terminals of said piezo film transducer and input terminals of said second audio amplifier.

14. The method of claim 9, further including the step of making the frequency response of said second audio amplifier flat over a desired audio frequency range between the low and high frequency rolloff of said second audio amplifier.

15. The method of claim 9, further including the step of mounting said first loudspeaker in a speaker enclosure in a manner for floating the cone of said first loudspeaker.

16. The method of claim 15, further including the step of acoustically damping said speaker enclosure for said first loudspeaker.

17. The method of claim 16, further including the step of making said speaker enclosure portless, and otherwise sealed except for an opening to emit soundwaves produced by said first loudspeaker.

18. The method of claim 17, wherein said second audio amplifier is a vacuum tube amplifier having a flat frequency response over a desired audio frequency range.

19. The method of claim 18, further including the step of overdriving said first audio amplifier and first loudspeaker to obtain a desired tonal effect on the sound outputted from said first and second loudspeakers.

20. In an audio system, a method for amplifying electrical audio signals from a sound source in a manner to obtain desired tonal quality at relatively low sound pressure levels with acceptable volume in the reproduced sound to minimize potential hearing loss to a listener, said method comprising the steps of:

obtaining a source of electrical audio signals;

amplifying said electrical audio signals;

applying said amplified electrical audio signals to a first loudspeaker including a cone and cone driving mechanism, for producing first sound signals;

attaching a piezo film transducer to a portion of the cone of said first loudspeaker, for obtaining from said transducer cone vibration electrical signals corresponding to the waveform of said first sound signals;

independently amplifying said cone vibration electrical signals;

applying said amplified cone vibration electrical signals to a second loudspeaker;

adjusting the high and low frequency rolloff of said cone vibration electrical signals to obtain a desired tonal quality in the sound produced by said first and second loudspeakers; and adjusting the amplification levels of said electrical audio signals and said cone vibration electrical signals to a desired level matching the acoustics of a room in which said audio system us operating.

21. The method of claim 20, further including the step of adjusting the level of amplification of said electrical audio signals to overdrive said first loudspeaker to obtain a desired tonal effect on the sound outputted from said first and second loudspeakers.

22. The method of claim 20, further including the step of making the amplification of said cone vibration electrical signals have a flat frequency response over a desired audio frequency range.

23. The method of claim 20, further including the step of mounting said first loudspeaker in a speaker enclosure in a manner for floating the cone of said first loudspeaker.

24. The method of claim 23, further including the step of acoustically damping said speaker enclosure for said first loudspeaker.

25. The method of claim 24, further including the step of making said speaker enclosure portless, and otherwise sealed except for an opening to emit soundwaves produced by said first loudspeaker.

26. The method of claim 25, further including the step of making the amplification of said cone vibration signals have a flat frequency response over a desired audio frequency range.

27. The method of claim 26, further including the step of adjusting the level of amplification of said electrical audio signals to overdrive said first loudspeaker to obtain a desired tonal effect on the sound outputted from said first and second loudspeakers.

28. A preamplifier for impedance matching and buffering a piezoelectric transducer pickup of a musical instrument for connection to a main amplifier, comprising:

a vacuum tube cathode follower circuit having an input terminal connected to an output terminal of said piezoelectric transducer, and an output terminal for connection to an input of said main amplifier.

29. The buffer preamplifier of claim 28, wherein said cathode follower circuit further includes:

a dual triode amplifier;

an RC impedance match circuit included in a first triode stage thereof; and a tone stack receiving an output signal from the cathode of a second triode stage thereof.

* * * * *